(12) United States Patent
Mosterman et al.

(10) Patent No.: US 9,117,039 B1
(45) Date of Patent: Aug. 25, 2015

(54) GENERATING A THREE-DIMENSIONAL (3D) REPORT, ASSOCIATED WITH A MODEL, FROM A TECHNICAL COMPUTING ENVIRONMENT (TCE)

(75) Inventors: Pieter J. Mosterman, Framingham, MA (US); Ebrahim Mehran Mestchian, Newton, MA (US); Jay R. Torgerson, Hopkinton, MA (US); Daniel F. Higgins, Hopkinton, MA (US); Paul F. Kinnucan, Milton, MA (US)

(73) Assignee: The MathWorks, Inc., Natick, MA (US)

( * ) Notice: Subject to any disclaimer, the term of this patent is extended or adjusted under 35 U.S.C. 154(b) by 519 days.

(21) Appl. No.: 13/533,841

(22) Filed: Jun. 26, 2012

(51) Int. Cl.
  *G06G 7/48* (2006.01)
  *G06F 17/50* (2006.01)

(52) U.S. Cl.
  CPC .................. *G06F 17/5009* (2013.01)

(58) Field of Classification Search
  USPC ............................................. 703/6
  See application file for complete search history.

(56) References Cited

U.S. PATENT DOCUMENTS

| | | | |
|---|---|---|---|
| 6,028,593 A | 2/2000 | Rosenberg et al. | |
| 8,954,195 B2 | 2/2015 | Summer et al. | |
| 2001/0037190 A1* | 11/2001 | Jung | 703/1 |
| 2002/0010655 A1 | 1/2002 | Kjallstrom | |
| 2002/0080139 A1 | 6/2002 | Koo et al. | |
| 2005/0105793 A1 | 5/2005 | Sorek et al. | |
| 2005/0257195 A1 | 11/2005 | Morrow et al. | |
| 2006/0008151 A1 | 1/2006 | Lin et al. | |
| 2006/0038816 A1 | 2/2006 | Guest et al. | |
| 2006/0150149 A1 | 7/2006 | Chandhoke et al. | |
| 2006/0199167 A1 | 9/2006 | Yang et al. | |
| 2008/0007568 A1 | 1/2008 | Chou et al. | |
| 2008/0013793 A1 | 1/2008 | Hillis et al. | |
| 2008/0062167 A1* | 3/2008 | Boggs et al. | 345/419 |
| 2009/0058799 A1 | 3/2009 | Huang et al. | |
| 2009/0061404 A1 | 3/2009 | Toly | |
| 2009/0073034 A1 | 3/2009 | Lin | |
| 2009/0315841 A1 | 12/2009 | Cheng et al. | |
| 2010/0009308 A1 | 1/2010 | Wen et al. | |
| 2011/0032255 A1 | 2/2011 | Favier et al. | |
| 2011/0040392 A1 | 2/2011 | Hamann et al. | |
| 2011/0106339 A1 | 5/2011 | Phillips et al. | |
| 2011/0205341 A1 | 8/2011 | Wilson et al. | |
| 2011/0261083 A1 | 10/2011 | Wilson | |

(Continued)

OTHER PUBLICATIONS

Co-pending U.S. Appl. No. 13/730,159 entitled "Altering an Attribute of a Model Based on an Observed Spatial Attribute" filed Dec. 28, 2012, by Mosterman et al., 51 pages.

(Continued)

*Primary Examiner* — Saif Alhija
(74) *Attorney, Agent, or Firm* — Harrity & Harrity, LLP

(57) ABSTRACT

A computing device may obtain a model that, when executed, simulates behavior of a dynamic system. The model may include a set of model elements that correspond to one or more physical elements associated with the dynamic system. The computing device may receive, based on obtaining the model, a request to generate a spatial representation associated with a physical element; generate a tag that includes a string of characters; associate the tag with a model element that corresponds to the physical element; cause, based on the tag and information associated with the physical element, the physical structure to be generated in a manner that includes the tag; receive the tag; and cause the model element to be displayed based on receiving the tag.

33 Claims, 15 Drawing Sheets

(56) References Cited

U.S. PATENT DOCUMENTS

| | | |
|---|---|---|
| 2012/0254830 A1 | 10/2012 | Conrad et al. |
| 2012/0276993 A1 | 11/2012 | Lerner et al. |
| 2012/0317501 A1 | 12/2012 | Milou |
| 2012/0320080 A1 | 12/2012 | Giese et al. |
| 2013/0332119 A1 | 12/2013 | Santiquet et al. |
| 2014/0132594 A1 | 5/2014 | Gharpure et al. |
| 2014/0157129 A1 | 6/2014 | Dinshaw et al. |
| 2014/0163930 A1 | 6/2014 | Balon et al. |
| 2014/0208272 A1 | 7/2014 | Vats et al. |
| 2014/0247260 A1 | 9/2014 | Ghoneima et al. |
| 2014/0327670 A1 | 11/2014 | Chen et al. |
| 2014/0365199 A1 | 12/2014 | Mosterman et al. |

OTHER PUBLICATIONS

Co-pending U.S. Appl. No. 13/730,092 entitled "Generic Human Machine Interface for a Graphical Model" filed Dec. 28, 2012, by Mosterman et al., 59 pages.

Co-pending U.S. Appl. No. 13/730,198 entitled "Linking of Model Elements to Spatial Elements" filed Dec. 28, 2012, by Ciolfi et al., 58 pages.

Co-pending U.S. Appl. No. 13/730,279 entitled "Interacting With a Model Via a Three-Dimensional (3D) Spatial Environment" filed Dec. 28, 2012, by Mosterman et al., 75 pages.

"3D Printing" From Wikipedia, the free encyclopedia, print date Jun. 26, 2012, 9 pages.

Nishino et al., "A virtual environment for modeling 3D objects through spatial interaction," IEEE International Conference on Systems, Man, and Cybernetics, IEEE SMC'99 Conference Proceedings, vol. 6, 1999, pp. 81-86.

LaViola et al., "3D Spatial Interaction: Applications for Art, Design, and Science," SIGGRAPH 2011 Course, 2011, 72 pages.

Wikipedia, "3D Printing," http://en.wikipedia.org/wik/3D_printing, May 25, 2012, 9 pages.

Izadi, Shahram, et al. "KinectFusion: real-time 3D reconstruction and interaction using a moving depth camera," Proceedings of the $24^{th}$ annual ACM symposium on User interface software and technology, ACM, 2011, pp. 559-568.

Piekarskim et al. "Integrated head and hand tracking for indoor and outdoor augmented reality." Proceedings of IEEE Virtual Reality, 2004, 8 pages.

Wikipedia, "Plug and Play," http://en.wikipedia.org/wiki/Plug_and_play, Dec. 29, 2014, 6 pages.

Tom Simonite, "Microsoft Has an Operating System for Your House", http://www.technologyreview.com/news/517221/microsoft-has-an-operating-system-for-your-house/?utm_campaign=newsletters&utm_source=newsletter-weekly-computing&utm_medium=email&utm_content=20130718, Jul. 18, 2013, 8 pages.

Microsoft, "Microsoft Research: The Lab of Things", http://www.lab-of-things.com/, Jun. 16, 2013, 1 page.

Microsoft, "Faculty Summit 2013", http://research.microsoft.com/en-us/events/fs2013/, Jul. 16, 2013, 2 pages.

Microsoft, "HomeOS: Enabling smarter homes for everyone", http://research.microsoft.com/en-us/projects/homeos/, Jun. 22, 2011, 3 pages.

\* cited by examiner

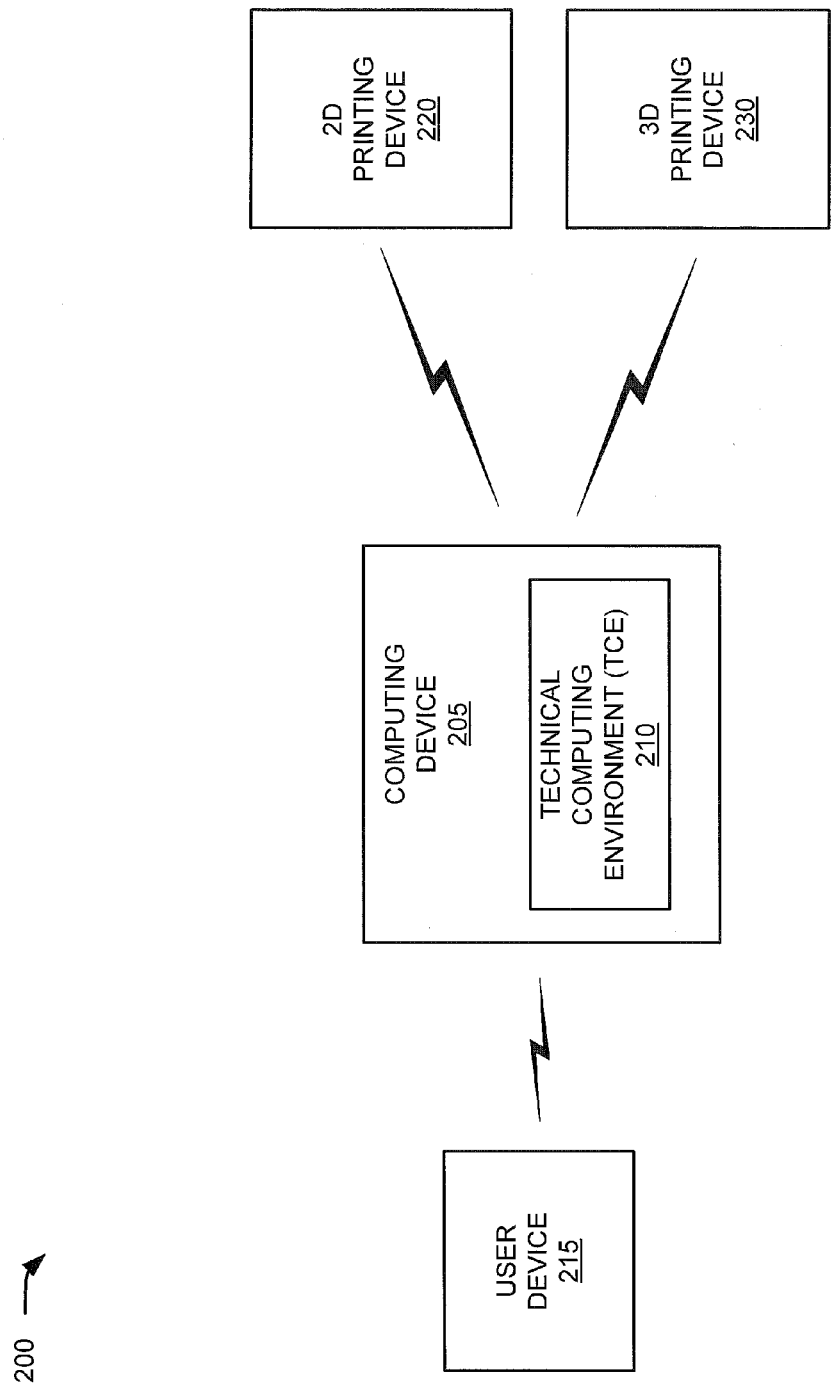

1200

1250

GENERATING A THREE-DIMENSIONAL (3D) REPORT, ASSOCIATED WITH A MODEL, FROM A TECHNICAL COMPUTING ENVIRONMENT (TCE)

BRIEF DESCRIPTION OF THE DRAWINGS

FIG. 2 is a diagram of an example environment in which systems and/or methods, described herein, may be implemented;

DETAILED DESCRIPTION OF PREFERRED EMBODIMENTS

Figure 1A:
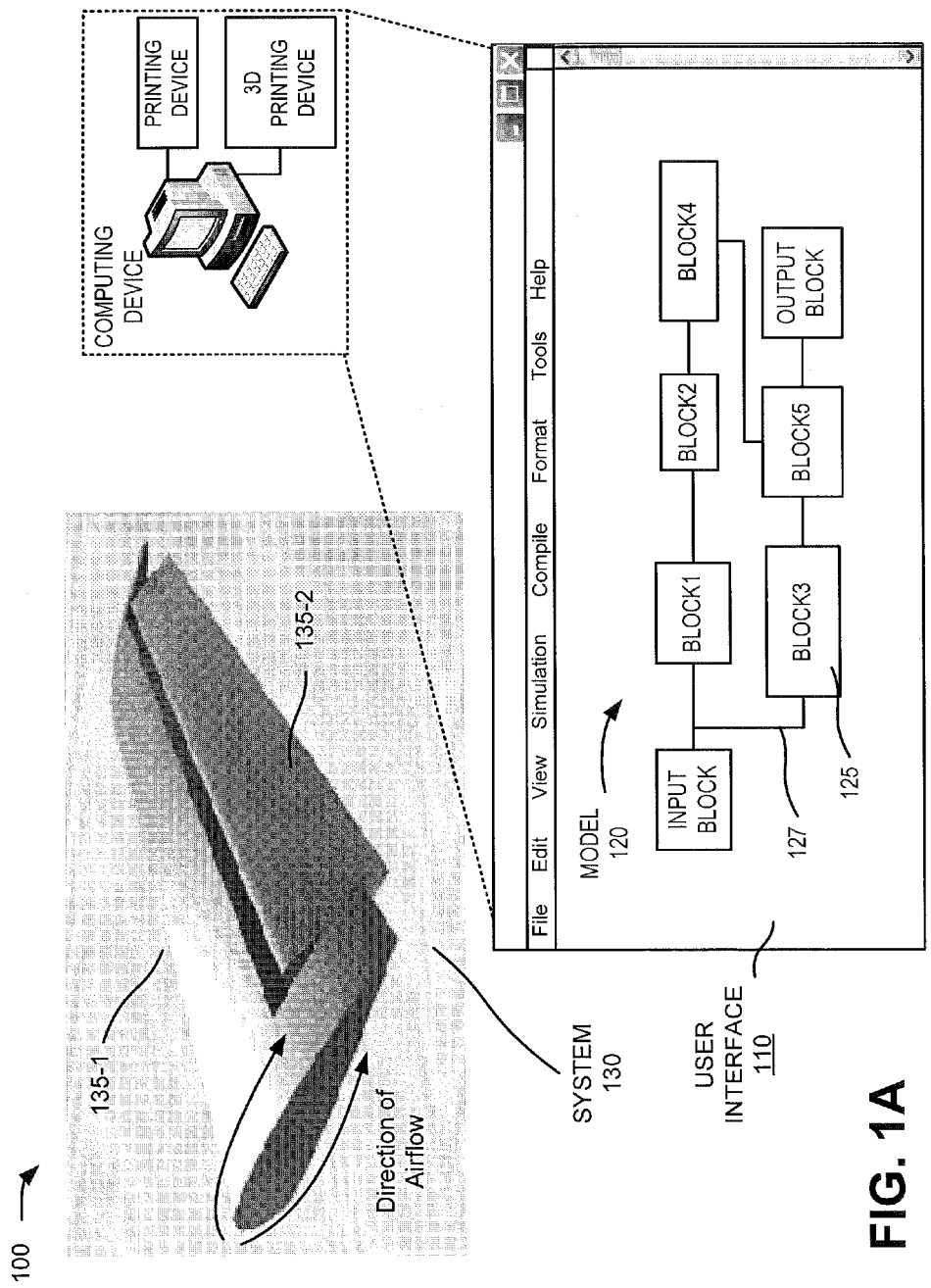
FIGS. 1A-1C are diagrams of an example overview of an implementation described herein.

The following detailed description refers to the accompanying drawings. The same labels and/or reference numbers in different drawings may identify the same or similar elements.

A model may include a set of model elements that, when executed, simulates behavior of a system (e.g., a mechanical device, an electrical circuit, a human organ, a physical phenomena, etc.). The system may include a set of physical elements that represent portions and/or components of the system. The model elements may correspond to physical elements and may, when executed, simulate the behavior of the physical elements and/or the system.

Systems and/or methods, described herein, may enable a technical computing environment (TCE) that uses a model to simulate a system to cause a two-dimensional (2D) representation and/or spatial representation, associated with the system or the model, to be generated. The 2D representation (sometimes referred to herein as a "2D report") may correspond to a two-dimensional (2D) physical representation, of a physical element, on print media (e.g., paper, transparency, etc.) and/or a projection of the physical element, on a display device, as a 2D image. The spatial representation (sometimes referred to herein as a "3D report") may correspond to a three-dimensional (3D) physical structure (hereinafter referred to as a "physical structure"), of the physical element, based on a volume of material (e.g., plastic, ceramic, metal, and/or some other material, etc.) and/or two or more projections of the physical element, on the display device, as a 3D spatial image (hereinafter referred to as "spatial image"). The spatial image may, for example, correspond to a stereoscopic representation, a multiscopic representation, a holographic representation, etc. The 2D representation (e.g., a 2D physical representation, a 2D image, etc.) and/or the spatial representation (e.g., a spatial image, etc.) may also, or alternatively, depict other information, such as model elements, parameters associated with the model elements, etc.

The systems and/or methods may enable the TCE to generate a tag and to associate the tag with a model element that, when executed, simulates behavior of a physical element. The tag may, for example, correspond to a string of characters, a bar code, quick response (QR) code, etc. The TCE may generate a report (e.g., a 2D report, a 3D report, etc.), corresponding to the physical element, in a manner that includes the tag (e.g., on a 2D physical representation, on a surface of a physical structure, embedded within a physical structure, within a 2D image, within a spatial image, etc.). An operator, associated with the TCE, may obtain the tag from the report and may provide the tag to a computing device that executes the TCE. The TCE may retrieve the model element with which the tag is associated and may provide the model element for display on the computing device. Retrieving the model element based on the tag may enable information associated with a model (e.g., parameters, programming code, information associated with the model elements, etc.) to be archived and/or easily retrieved based on the tag associated with report.

Systems and/or methods, as described herein, may use computing environments, such as TCEs, for performing computing operations. A TCE may include any hardware and/or software based logic that provides a computing environment that allows tasks to be performed (e.g., by users) related to disciplines, such as, but not limited to, mathematics, science, engineering, medicine, and business. The TCE may include text-based environments (e.g., MATLAB® software), a graphically-based environment (e.g., Simulink® software, Stateflow® software, SimEvents® software, etc., by The MathWorks, Inc.; VisSim by Visual Solutions; LabView® by National Instruments; etc.), or another type of environment, such as a hybrid environment that may include, for example, one or more of the above-referenced text-based environments and one or more of the above-referenced graphically-based environments.

The TCE may be integrated with or operate in conjunction with a graphical modeling environment, which may provide graphical tools for constructing models or systems or processes. The TCE may include additional tools, such as tools designed to convert a model into an alternate representation, such as source computer code, compiled computer code, or a hardware description (e.g., a description of a circuit layout). This alternate representation may also include a link to a the tag that is associated with the model element. The tag, thus may enable the TCE to navigate to the model element and/or to one or more hierarchical levels of a model in which the model element exists. Additionally, or alternatively, the tag may enable the TCE to navigate to an element, in the alternative representation, that includes the link to the tag. Additionally, or alternatively, that tag may enable the TCE to navigate to one or more hierarchical levels, of the alternate representation, in which the element exists. In an implementation, the TCE may provide this ability using graphical toolboxes (e.g., toolboxes for signal processing, image processing, color manipulation, data plotting, parallel processing, etc.). In another implementation, the TCE may provide these functions as block sets. In still another implementation, the TCE may provide these functions in another way.

Models generated with the TCE may be, for example, models of a physical system, a computing system, an engineered system, an embedded system, a biological system, a chemical system, etc.

A model generated with the TCE may include, for example, any equations, assignments, constraints, computations, algorithms, and/or process flows. The model may be implemented as, for example, time-based block diagrams (e.g., via the Simulink® product, available from The MathWorks, Incorporated), discrete-event based diagrams (e.g., via the SimEvents® product, available from The MathWorks, Incorporated), dataflow diagrams, state transition diagram (e.g., via the Stateflow® product, available from The MathWorks, Incorporated), software diagrams, a textual array-based and/or dynamically typed language (e.g., via the MATLAB® product, available from The MathWorks, Incorporated), and/or any other type of model.

The values of attributes of a model generated with the TCE may be set to characteristics settings, such as one or more inherited settings, one or more default settings, etc. For example, the data type of a variable that is associated with a block may be set to a default such as a double. Because of the default setting, an alternate data type (e.g., a single, an integer, a fixed point, etc.) may be inferred based on attributes of elements that the model comprises (e.g., the data type of a variable associated with a connected block) and/or attributes of the graphical model. As another example, the sample time associated with a block may be set to be inherited. In case of an inherited sample time, a specific sample time may be inferred based on attributes of elements that the graphical model comprises and/or attributes of the graphical model (e.g., a fundamental execution period). This inference may be performed by propagation of model element attributes. For example, after evaluating the sample time attribute of a first block, a graph search proceeds by evaluating the sample time attribute of a second block that is directly connected to the first block. The evaluating of the sample time attribute of the second block may account for the sample time attribute value of the first block (e.g., by adopting the value of the sample time attribute of the first block).

As previously mentioned, an example embodiment of the TCE may use one or more text-based products, such as textual modeling environments. For example, a text-based modeling environment, may be implemented using products such as, but not limited to, MATLAB by The MathWorks, Inc.; Octave, Python, Comsol Script, and MATRIXx from National Instruments; Mathematica from Wolfram Research, Inc.; Mathcad from Mathsoft Engineering & Education Inc.; Maple from Maplesoft; Extend from Imagine That Inc.; Scilab from The French Institution for Research in Computer Science and Control (INRIA); Virtuoso from Cadence; or Modelica or Dymola from Dynasim. In some embodiments, the text-based modeling environment may include hardware and/or software based logic that provides a computing environment that allows users to perform tasks related to disciplines, such as, but not limited to, mathematics, science, engineering, medicine, business, etc., more efficiently than if the tasks were performed in another type of computing environment, such as an environment that required the user to develop code in a conventional programming language, such as C++, C, Fortran, Pascal, etc.

In an implementation, the text-based modeling environment may include a dynamically typed language that may be used to express problems and/or solutions in mathematical notations familiar to those of skill in the relevant arts. For example, the modeling environment may use an array as a basic element, where the array may not require dimensioning. These arrays may be used to support array programming in that operations can apply to an entire set of values, such as values in an array. Array programming may allow array-based operations to be treated as a high-level programming technique or model that lets a programmer think and operate on whole aggregations of data without having to resort to explicit loops of individual non-array, i.e., scalar operations.

The modeling environment may further be adapted to perform matrix and/or vector formulations that may be used for data analysis, data visualization, application development, simulation, modeling, algorithm development, etc. These matrix and/or vector formulations may be used in many areas, such as statistics, finance, image processing, signal processing, control design, life sciences, education, discrete event analysis and/or design, state based analysis and/or design, etc.

In another example embodiment, the TCE may be implemented in a graphically-based modeling environment using products such as, but not limited to, Simulink®, Stateflow®, SimEvents™, etc., by The MathWorks, Inc.; VisSim by Visual Solutions; LabView® by National Instruments; Dymola by Dynasim; SoftWIRE by Measurement Computing; WiT by DALSA Coreco; VEE Pro or SystemVue by Agilent; Vision Program Manager from PPT Vision; Khoros from Khoral Research; Gedae by Gedae, Inc.; Scicos from (INRIA); Virtuoso from Cadence; Rational Rose from IBM; Rhopsody or Tau from Telelogic; Ptolemy from the University of California at Berkeley; or aspects of a Unified Modeling Language (UML) or SysML environment.

Figure 1B:
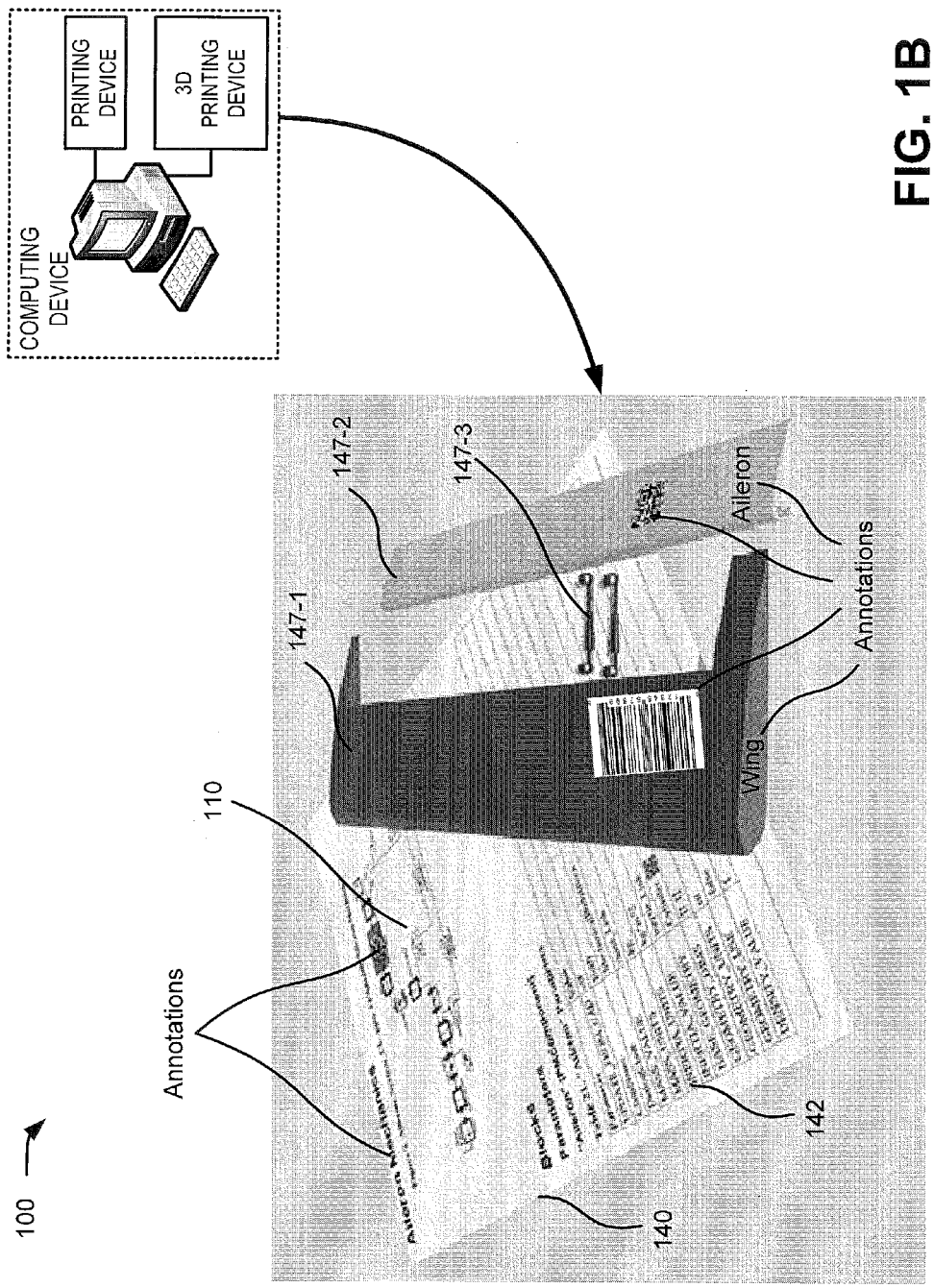
Figure 1C:
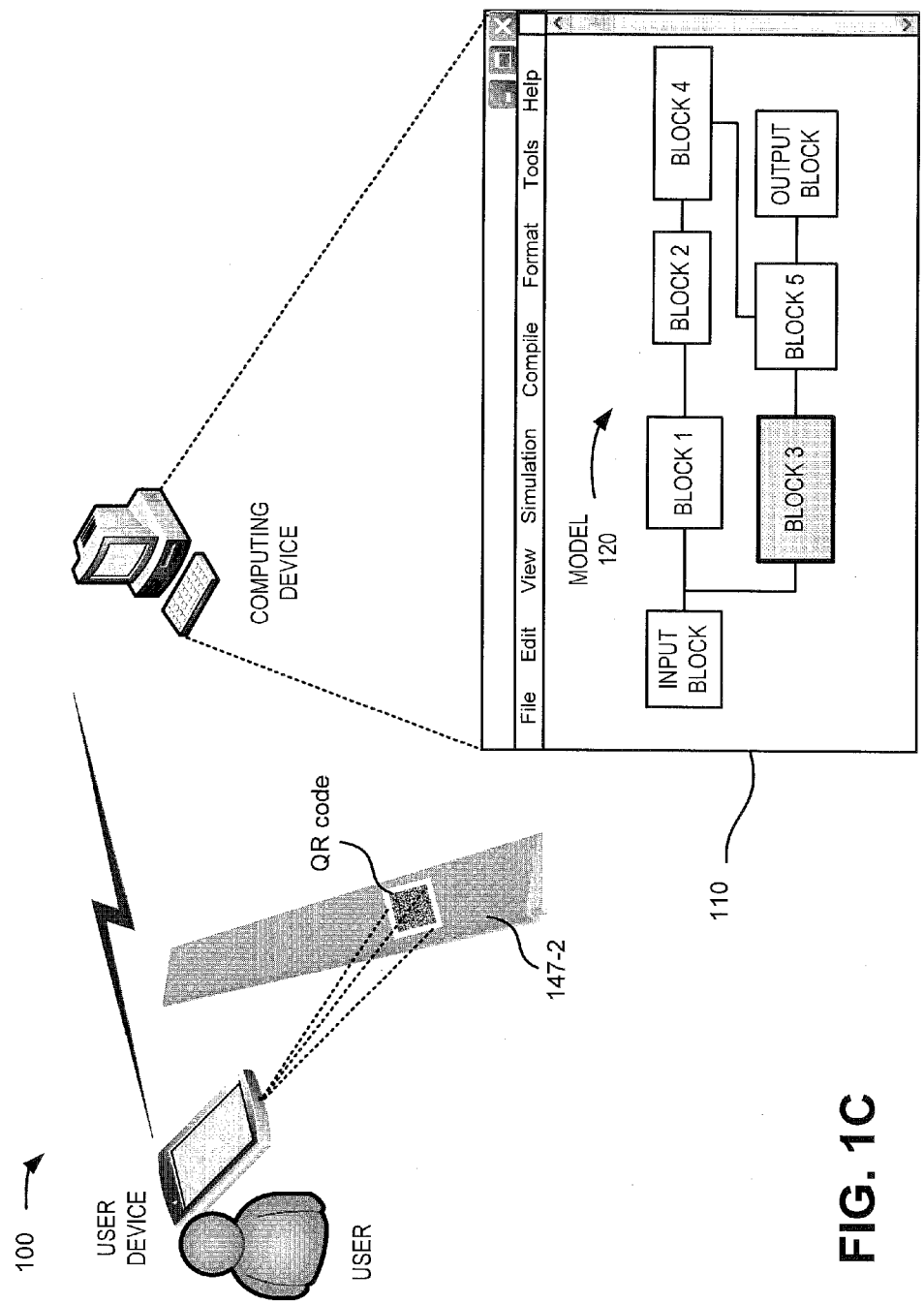

FIGS. 1A-1C are diagrams of an example overview 100 of an implementation described herein. As shown in FIG. 1A, example overview 100 may includes a computing device that is connected to a printing device and a 3D printing device. The printing device may receive information, from the computing device, and may print a two-dimensional (2D) physical representation (e.g., a paper copy) based on the received information. The 3D printing device may receive information, from the computing device, and may generate a 3D physical structure (e.g., based on plastic, metal, ceramic, and/or some other material) based on the received information. The computing device may also display 2D images and/or 3D spatial images.

The computing device may provide a user interface 110 to enable a user, of the computing device, to create, modify, and/or interact with a model 120 that is hosted by the computing device. Model 120 may include a set of model elements, such as a set of blocks 125 (hereinafter referred to collectively as "blocks 125" and individually as "block 125") and/or connectors 127 (hereinafter referred to collectively as "connectors 127" and individually as "connector 127"). Block 125 may include logic that can be executed by the computing device. Connector 127 may logically connect two or more blocks 125 that enables blocks 125 to communicate with each other. The computing device may execute blocks 125 to simulate behavior of a system 130 (e.g., shown as a wing and aileron in the presence of airflow). Alternatively, or additionally, the computing device may execute blocks 125 to verify, compute a steady state operating point, trim, or linearize the model 120.

System 130 may correspond to a static system (e.g., an artifact, a physical object, etc.), a dynamic system (e.g., mechanical device, an electrical circuit, a human organ, a physical phenomena, etc.), or some combination thereof. System 130 may include a collection of physical elements 135 (hereinafter referred to collectively as "physical elements 135" and individually as "physical element 135"). Physical element 135 may correspond to components of system 130. A first physical element 135 (e.g., physical element 135-1) may, for example, correspond to a first component of system 130 (e.g., shown as a wing) and a second physical element 135 (e.g., physical element 135-2) may correspond to a second component of system 130 (e.g., such as an aileron) that is attached to the first physical element 135. System 130 may include one or more other physical elements 135 (not shown).

Thus, blocks 125 may correspond to physical elements 135 and connectors may correspond to interactions between physical elements 135. When the blocks are executed, behavior of physical elements 135 (e.g., an amount of flex, an amount of force, a velocity, an angle between the wing and aileron, etc.) may be simulated.

As shown in FIG. 1B, the computing device may cause reports, associated with system 130 and/or model 120, to be generated. For example, the computing device may cause the printing device to generate report 140 that corresponds to a 2D physical representation of one or more model elements associated with model 120. Report 140 may also, or alternatively, include parameters 142 associated with the model elements. Parameters 142 may, for example, include information, associated with a particular block 125 that enables behavior of a particular physical element 135 to be simulated when the particular block 125 is executed. Report 140 may also, or alternatively, correspond to a 2D physical representation of one or more physical elements 135 (e.g., images, drawings, etc.).

Additionally, or alternatively, the computing device may cause the 3D printing device to generate one or more physical structures 147 (hereinafter referred to collectively as "structures 147" and individually as "structure 147") that correspond to physical elements 135. For example, a first structure 147 (e.g., 147-1) may correspond to physical element 135-1 (e.g., the wing); a second structure 147 (e.g., 147-2) may correspond to physical element 135-2 (e.g., the aileron); a third structure 147 (e.g., 147-3) may correspond to physical element 135-3 (e.g., a mechanism that connects or controls orientation of physical element 135-2 relative to physical element 135-1); etc.

Report 140 and/or structure 147 may include annotations. For example, report 140 may include annotations that identify blocks 125, connectors 127, physical elements 135, parameters associated with blocks 125, etc. Structure 147 may include annotations that identify and/or describe structure 147 (e.g., labels, titles, identifiers, etc.). Additionally, or alternatively, report 140 and/or structure 147 may include annotations that identify a storage location (e.g., a filename, etc.), associated with the computing device (or another device), from which other information, associated with report 140 and/or structure 147, can be obtained.

Additionally, or alternatively, an annotation may correspond to a tag (e.g., a string of characters, a bar code, a QR code, etc.). For example, the computing device may generate a tag and may associate the tag with a particular block 125 that corresponds to a particular physical element 135. The computing device may, in one example, cause report 140, associated with the particular physical element 135, to be generated in a manner that includes the tag. The computing device may also, or alternatively, cause structure 147, that represents the particular physical element 135, to be generated in a manner that includes the tag on a surface of structure 147 (e.g., via an adhesive label, an inscription, by printing, etc.) and/or embedded within structure 147 (e.g., beneath one or more layers of material). A user, of the computing device, may use the tag, associated with report 140 and/or structure 147, to obtain information associated with block 125 and/or physical element 135 on which report 140 and/or structure 147 are based.

For example, as shown in FIG. 1C, a user may use a device (e.g., a user device, etc.) to scan a tag (e.g., shown as a QR code) on a surface of physical structure 147-2 and the user device may transmit the tag to the computing device. The tag may also, or alternatively, be provided to the computing device in other ways (e.g., via a user interface, a keyboard, etc.). The computing device may use the tag to retrieve one or more blocks 125 with which the tag is associated and may provide blocks 125, for display, via user interface 110. Additionally, or alternatively, the computing device may determine that the tag is associated with a particular blocks 125 (e.g., block 3) and may cause an appearance, associated with the particular block 125, to change with respect to other blocks 125. Additionally, or alternatively, the computing device may, in a manner to be described in greater detail below, perform other acts in addition to, or instead of, changing the appearance of the identified block 125. For example, the computing device may navigate (e.g., by zooming in, zooming out, etc.) to a portion of model 120 that corresponds to the particular block 125. Additionally, or alternatively, the computing device may navigate to a different hierarchical level of model 120, such as a level that includes blocks associated with the particular block 125.

FIG. 2 is a diagram of an example environment 200 in which systems and/or methods, described herein, may be implemented. As illustrated, environment 200 may include a computing device 205, a user device 215, a two-dimensional (2D) printing device 220, and a three-dimensional (3D) printing device 230. While FIG. 2 includes particular devices, in alternative implementations, environment 200 may include additional devices, fewer devices, different devices, or differently arranged devices than depicted in FIG. 2.

Computing device 205 may include one or more devices that gather, process, search, store, and/or provide information in a manner similar to that described herein. For example, computing device 205 may include a server, a workstation, a mainframe, a computer (e.g., a desktop computer, a laptop computer, a tablet computer, etc.) and/or some other type of computational device. Computing device 205 may communicate with 2D printer device 220 and/or 3D printer device 230 to generate a 2D representation and/or a spatial representation, respectively, associated with a physical element. In one example, the 2D representation may represent a projection of a physical element, from a particular viewing angle, as a 2D physical representation. In another example, the 2D representation may include two or more, possibly superimposed, projections of the physical element, from two or more viewing angles (e.g., that represent stereoscopic and/or multiscopic viewing angles), as a 2D physical representation.

Computing device 205 may host TCE 210. TCE 210 may include hardware-based logic and/or a combination of hardware and software-based logic that provides a computing environment. The computing environment may permit a user to perform tasks related to a discipline or a domain. For example, the computing environment may pertain to mathematics, science, engineering, medicine, business, and/or another type of discipline or domain. Computing device 205 may include a component that is capable of scanning a tag (e.g., a string of characters, a bar code, a QR code, etc.) associated with a 2D representation (e.g., a 2D physical representation, a 2D image, etc.) and/or a spatial representation (e.g., a physical structure, a spatial image, etc.) to obtain the tag.

TCE 210 may include a dynamically typed language (e.g., a dynamically typed programming language) that can be used to express problems and/or solutions in mathematical notations. For example, TCE 210 may use an array as a basic element, where the array may not require dimensioning. In addition, TCE 210 may perform matrix and/or vector formulations that can be used for data analysis, data visualization, application development, modeling, algorithm development, simulation, training, testing, etc. These matrix and/or vector formulations may be used in many areas, such as statistics, finance, image processing, signal processing, control design, life sciences, education, discrete event analysis and/or design, state based analysis and/or design, etc.

TCE 210 may further provide mathematical functions and/or graphical tools (e.g., for creating plots, surfaces, images, models, volumetric representations, etc.). In an implementation, TCE 210 may provide these functions and/or tools using toolboxes (e.g., toolboxes for signal processing, image processing, data plotting, parallel processing, etc.). Additionally, or alternatively, TCE 210 may provide these functions as blocks or block sets. Additionally, or alternatively, TCE 210 may provide these functions in another way, such as via a catalog or a library. For example, in some implementations, an array of blocks and/or other types of model elements may be provided in a library (e.g., a model library) that a user may use to identify and/or include blocks in a given model.

TCE 210 may include a user interface for creating, compiling, transforming, executing, analyzing, validating, etc., a model of a system. TCE 210 may provide an environment for modeling the system. For example, TCE 210 may include a graphical-based environment, a textual-based environment, and/or a hybrid environment (e.g., a combination of graphical and textual environments). TCE 210 may include a command line interface to interface with the environment for modeling the system. TCE 210 may connect, access, and/or interface with other software applications, data, devices, and/or other types of resources during a modeling process.

TCE 210 may connect, access, and/or interface with other software applications, data, devices, and/or other types of resources during a modeling process and/or a simulation process. For instance, in some implementations, computing device 205 may include, or be in communication with, devices (e.g., an electronic circuit, a particular type of measurement or sensor device, a power source, etc.) that may assist in developing a particular model and/or producing a simulation corresponding to the particular model. As such, computing device 205 and/or TCE 210 may include a wide variety of systems and devices.

User device 215 may include one or more devices capable of communicating with computing device 205. For example, user device 215 may include a personal computer, a laptop computer, a tablet computer, a wireless mobile device, a camera, or another type of device. User device 215 may include a component that is capable of scanning a tag (e.g., a string of characters, a bar code, a QR code, etc.) associated with a 2D representation and/or a spatial representation to obtain the tag. Additionally, or alternatively, user device 215, may receive the tag and/or other information (e.g., a file name, a keyword, a phrase, etc.) from a user of user device 215. User device 215 may transmit the tag and/or the other information to computing device 205.

2D printing device 220 may include one or more components capable of receiving data, processing the data, and/or generating a 2D physical representation based on the data. 2D printing device 220 may include a laser printer, an inkjet printer, a thermal printer, a photocopier, and/or some other printing device. 2D printing device 220 may, for example, receive report information from computing device 210 and may generate a 2D physical representation based on the report information.

3D printing device 230 may include one or more components capable of receiving data, processing the data, and/or generating a 3D physical structure based on the data. 3D printing device 230 may, in one example, include a 3D printer. 3D printing device 230 may receive report information and may, based on the report information, generate a three dimensional physical structure based on a base material, such as plastic (e.g., thermoplastic, photopolymer, plastic film, etc.), metal (e.g., titanium alloys, metal powder, eutectic metal, etc.), ceramic (e.g., ceramic powder, etc.), plaster, etc. In one example, 3D printer 230 may use one or more known three-dimensional printing techniques and/or technologies, such as stereolithography technology (e.g., photopolymerization); additive process technology (e.g., selective laser sintering, molten polymer deposition, granular materials binding, etc.); and/or other three-dimensional printing techniques and/or technologies.

Figure 3:
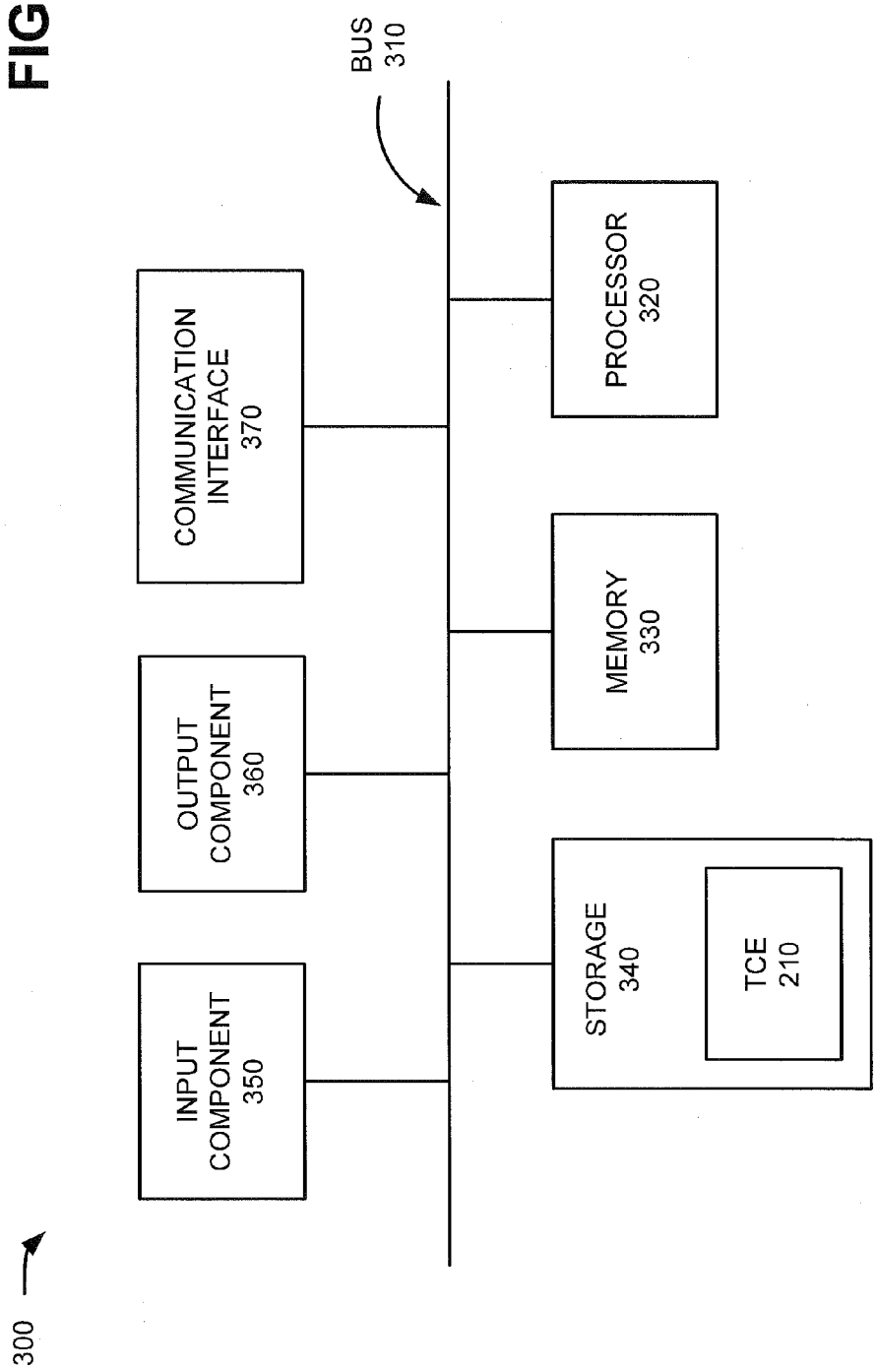
FIG. 3 is a diagram of example components of one or more devices of FIG. 2 according to one or more implementations described herein.

FIG. 3 is a diagram of an example device 300 that may correspond to computing device 205, user device 215, 2D printing device 220, and/or 3D printing device 230. Alternatively, each of computing device 205, user device 215, 2D printing device 220, and/or 3D printing device 230 may include one or more devices 300. As shown in FIG. 3, device 300 may include bus 310, processor 320, memory 330, storage 340, input component 350, output component 360, and/or communication interface 370. In other implementations, device 300 may include fewer components, additional components, different components, and/or a different arrangement of components than those depicted in FIG. 3. Additionally, or alternatively, a component of device 300 may perform an act described as being performed by another component of device 300.

Bus 310 may permit communication among the other components of device 300. For example, bus 310 may include a system bus, an address bus, a data bus, and/or a control bus. Bus 310 may also include bus drivers, bus arbiters, bus interfaces, and/or clocks.

Processor 320 may interpret and/or execute instructions. For example, processor 320 may include a general-purpose processor, a microprocessor, a data processor, a graphical processing unit (GPU), a co-processor, a network processor, an application specific integrated circuit (ASIC), an application specific instruction-set processor (ASIPs), a system-on-chip (SOC), a controller, a programmable logic device (PLD), a chipset, and/or a field programmable gate array (FPGA).

Memory 330 may store data and/or instructions related to the operation and use of device 300. For example, memory 330 may store data and/or instructions that may be configured to implement an implementation described herein. Memory 330 may include, for example, a random access memory (RAM), a dynamic random access memory (DRAM), a static random access memory (SRAM), a synchronous dynamic random access memory (SDRAM), a ferroelectric random access memory (FRAM), a read only memory (ROM), a programmable read only memory (PROM), an erasable programmable read only memory (EPROM), an electrically erasable programmable read only memory (EEPROM), and/or a flash memory.

Storage 340 may store data and/or software related to the operation and use of device 300. For example, storage 340 may include a hard disk (e.g., a magnetic disk, an optical disk, a magneto-optic disk, a solid state disk, etc.), a compact disc (CD), a digital versatile disc (DVD), a floppy disk, a cartridge, a magnetic tape, and/or another type of computer-readable medium, along with a corresponding drive. Memory 330 and/or storage 340 may also include a storing device external to and/or removable from device 300, such as a Universal Serial Bus (USB) memory stick, a hard disk, etc. In an implementation, as illustrated, storage 340 may store TCE 210.

Input component 350 may permit the user and/or another device to input information into device 300. For example, input component 350 may include a keyboard, a keypad, a mouse, a display (e.g., a touch screen), a touchpad, a button, a switch, a microphone, a camera, an accelerometer, a gyroscope, neural interface logic, voice recognition logic, an input port, and/or some other type of input component. Output component 360 may permit device 300 to output information to the user and/or another device. For example, output component 360 may include a display, a speaker, a light emitting diode (LED), a haptic device, a tactile device, an output port, and/or some other type of output component.

Communication interface 370 may permit device 300 to communicate with other devices, networks, and/or systems. Communication interface 370 may include a transceiver-like component. For example, communication interface 370 may include an Ethernet interface, an optical interface, a coaxial interface, a radio interface, and/or some other type of wireless and/or wired interface.

As will be described in detail below, device 300 may perform certain operations relating to implementations described herein. Device 300 may perform these operations in response to processor 320 executing software instructions (e.g., computer program(s)) contained in a computer-readable medium, such as memory 330 and/or storage 340. A computer-readable medium may be defined as a non-transitory memory device. A memory device may include space within a single physical memory device or spread across multiple physical memory devices. The software instructions may be read into memory 330 from another computer-readable medium, such as storage 340, or from another device via communication interface 370. The software instructions contained in memory 330 may cause processor 320 to perform processes described herein. Alternatively, hardwired circuitry may be used in place of or in combination with software instructions to implement processes described herein. Thus, implementations described herein are not limited to any specific combination of hardware circuitry and software.

Figure 4:
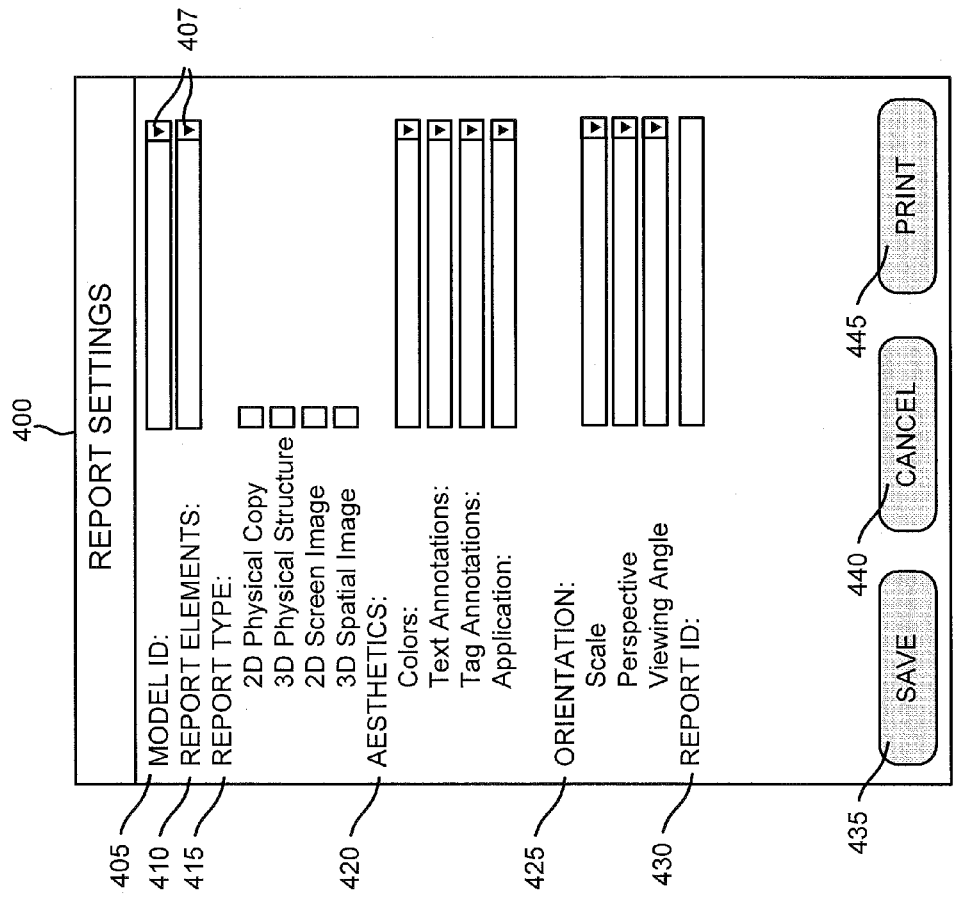
FIG. 4 is a diagram of example user interface via which a user may specify report settings to be used to generate a two-dimensional report and/or a three-dimensional report.

FIG. 4 is a diagram of example user interface 400 via which a user may specify report settings to be used to generate a 2D report and/or a 3D report. User interface 400 may be provided, for display, on computing device 205. For example, a user, of computing device 205, may interact with TCE 210, which may cause TCE 210 to provide, for display, user interface 400. User interface 400 may include a collection of fields and/or buttons, such as a model identifier (ID) field 405, a report elements field 410, a report type field 415, an aesthetics field 420, an orientation field 425, a report ID field 430, a save button 435, a cancel button 440, and a print button 445. Particular fields and/or buttons, shown with respect to user interface 400, are included for explanatory purposes. In other implementations, there may be additional fields and/or buttons, fewer fields and/or buttons, different fields and/or buttons, or differently arranged fields and/or buttons.

Model ID field 405 may enable a user, associated with computing device 205, to enter information that identifies a particular model that, when executed, simulates a particular system. The information that identifies the model may include, for example, a model name, a file name, a model identifier, etc. The user may also, or alternatively, identify the model by selecting a pull-down button 407 that causes a pull-down menu to be displayed. The menu may provide a list of models (e.g., a list of model names, file names, model identifiers, etc.) that can be selected by the user. Model ID field 405 may also, or alternatively, be pre-populated by TCE 210 when the user selects a model element (e.g., by right-clicking using a pointing device, etc.), depicted within a user interface, to be printed.

Report elements field 410 may enable the user to enter information that identifies a physical element (e.g., a physical element identifier, name, file name, etc.), associated with the particular system, for which a 2D report and/or 3D report is to be generated. The user may also, or alternatively, select the physical element, from a list of physical elements within a menu, by selecting pull-down menu button 407 associated with report elements field 410. Report elements field 410 may also enable the user to specify other information to be included within the 2D and/or 3D report, such as, for example, a model element, parameters associated with the model element, etc. Report elements field 410 may also, or alternatively, be pre-populated by TCE 210 when the user selects a representation, associated with a physical element (e.g., by right-clicking using a pointing device, etc.) depicted within a user interface, to be printed.

Report type field 415 may enable the user to select a type of report to be generated. Report type field 415 may, for example, include a list of report types (e.g., a 2D physical representation, a physical structure, a 2D image, a spatial image, etc). The user may, for example, select a report type by selecting a box (e.g., using a pointing device and/or by causing a character or symbol, such as an "X" or some other character or symbol, to be inserted in the box) that corresponds to a report type desired by the user. A default report type (e.g., 2D image and/or some other default report type) may be selected by the user and/or may be predetermined, by computing device 205, when the user does not enter or select a report type. The user may also, or alternatively, identify more than one type of report to be generated.

Aesthetics field 420 may enable the user to enter aesthetic features to be included as part of the report, such as colors, text annotations, decal annotations, tag annotations, placement of annotations, etc. For example, the user may enter colors and/or select from a list of colors (e.g., from a pull-down menu) associated with text, background, physical elements, model elements, user interface borders, etc. One or more default colors may be selected by the user and/or may be predetermined, by computing device 205, when the user does not enter or select a color. The user may also, or alternatively, enter text annotations (e.g., titles, file names, identifiers, etc.) to be included in the report. In this example, the user may enter a report title; a file name associated with a report; a name, file name, and/or identifier associated with a physical element and/or model element; etc.

The user may also, or alternatively, identify whether and/or what type of tag (e.g., a string of characters, a bar code, a QR code, and/or some other type of tag) is to be included with the report. For example, the user may enter and/or select (e.g., from a list of indications within a pull-down menu) an indication that indicates that a tag is not to be included with the report. Additionally, or alternatively, the user may enter and/or select another indication that a tag is to be included with the report. The user may also, or alternatively, identify for which physical element, model element, etc., that the tag is to be provided. A default tag (e.g., a QR code or some other tag)

may be selected by the user and/or may be predetermined, by computing device 205, when the user does not enter or select a tag annotation.

The user may also, or alternatively, identify an application method to be used to provide the annotations specified for the report. For example, the user may enter an application method and/or may select (e.g., from a list of application methods within a pull-down menu) an indication that the annotations are to be printed on a 2D physical representation and/or on a surface physical structure; inscribed and/or etched into a surface of a physical structure; embedded within a base material of a physical structure; and/or attached to a surface of a 2D physical representation and/or physical structure using a decal (e.g., using some type of adhesive, etc.). A default application method (e.g., printing) may be selected by the user and/or may be predetermined, by computing device 205, when the user does not enter or select an application scheme and when a 2D physical representation and/or physical structure are to be generated.

Orientation field 425 may enable a user to enter a scale and/or select a scale (e.g., from a list of scales within a pull-down menu) to be used to generate the report. For example, the user may enter a scale (e.g., one inch, within the report, is equivalent to six inches with respect to a physical structure, 2D physical representation, etc.). A default scale may be selected by the user and/or may be predetermined, by computing device 205, when the user does not enter or select a scale. Orientation field 425 may also, or alternatively, enable a user to enter a perspective (e.g., a zero-point, a one-point, a two-point, a three-point, etc. perspective) and/or select a perspective (e.g., from a list of perspectives within a pull-down menu) with which a 2D physical representation, 2D image, and/or spatial image is to be generated.

Additionally, or alternatively, orientation field 425 may enable a user to enter a viewing angle and/or select a viewing angle (e.g., from a list of viewing angles in a pull-down menu) to be used to generate the report. For example, the user may specify an elevation angle (e.g., $\theta$) relative to a first axis (e.g., a X-axis) associated with the physical element; an azimuth angle (e.g., $\phi$) relative to a second axis (e.g., a Y-axis) associated with the physical element; a roll angle (e.g., $\alpha$) relative to a third axis (e.g., a Z-axis) associated with the physical element; etc. to be used to generate the report. The axes may, in one example, represent three spatial dimensions that are orthogonal to each other. A default perspective (e.g., three-point or some other perspective) and/or a default viewing angle (e.g., zero degree elevation, azimuth, and/or roll angle or some other viewing angle) may be selected by the user and/or may be predetermined, by computing device 205, when the user does not select a perspective and/or a viewing angle.

Report ID field 430 may enable the user to enter or select (e.g., from a list within a pull-down menu) an identifier with which the report is to be associated (e.g., based on a report name, an identifier, a file name, etc.). Additionally, or alternatively, computing device 205 may automatically assign an identifier to the report when the user does not enter or select the identifier with which the report is to be associated.

Save button 435 may, when selected by the user, cause the report settings, specified in fields 405-430 to be saved in a memory associated with computing device 205. Cancel button 440 may, when selected by the user, cause computing device 205 to close user interface 400. Print button 445 may, when selected by the user, instruct computing device 205 to cause a spatial representation to be printed and/or displayed based on information received via user interface 400.

Figure 5:
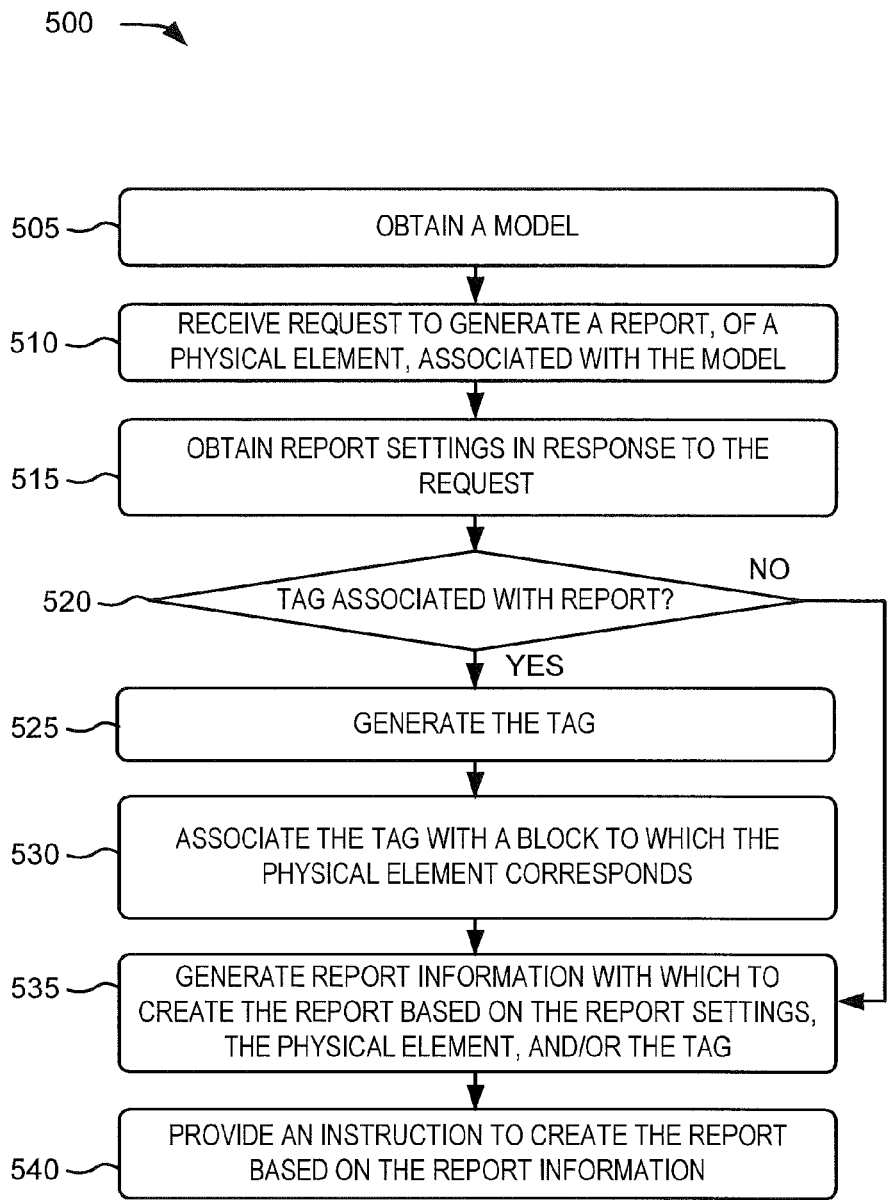
FIG. 5 is a flow chart of an example process for generating a two-dimensional and/or three-dimensional report associated with a model and retrieving one or more model elements based on a tag obtained from the two-dimensional and/or three-dimensional report.
Figure 6:
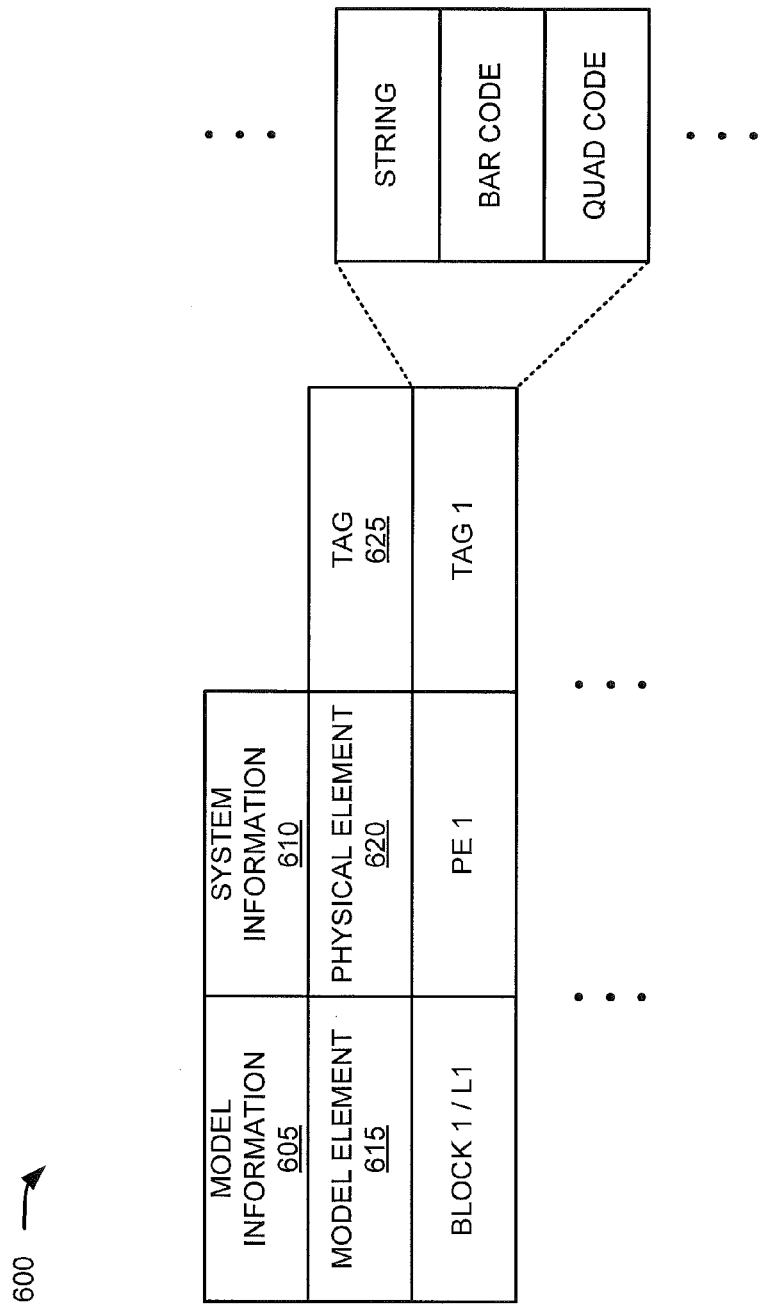
FIG. 6 is a diagram of an example data structure that stores information that associates a tag with a model element or a physical element.

FIG. 5 is a flow chart of an example process 500 for generating a 2D report and/or 3D report associated with a model and retrieving one or more model elements based on a tag obtained from the 2D report and/or 3D report. In one implementation, process 500 may be performed by computing device 205. Additionally, or alternatively, process 500 may be performed by a device, or group of devices, separate from, or in combination with, computing device 205. FIG. 6 is a diagram of an example data structure 600 that stores information that associates a tag with a model element or a physical element. In the description below, all or a portion of process 500 will be described with references to data structure 600 of FIG. 6.

As shown in FIG. 5, process 500 may include obtaining a model (block 505) and receiving a request to generate a report, of a physical element, associated with the model (block 510). For example, an operator, of computing device 205, may desire to generate a 2D representation and/or a spatial representation associated with one or more physical elements of a system. The user may, thus, request computing device 205 to obtain a model (e.g., model 120) that includes a group of model elements, such as blocks 125, connectors 127, etc., associated with the system. Computing device 205 may, in response to the request, instruct TCE 210 to provide the model. TCE 210 may receive the instruction and may retrieve the model from a memory associated with computing device 205. TCE 210 may provide the one or more model elements for display, via a user interface, on computing device 205. The user may interact with the user interface and may provide, via the user interface, a request to print a report (e.g., a 2D report and/or a 3D report). The request may, in one example, identify a physical element, associated with block 125, that is depicted by the user interface. Additionally, or alternatively, the request may indicate that a report is to be generated that includes block 125 (e.g., selected by the user via the user interface) and/or that includes parameters associated with the selected block 125.

As also shown in FIG. 5, process 500 may include obtaining report settings in response to the request (block 515). For example, TCE 210 may, in response to the request to generate the report, retrieve report settings, from a memory associated with computing device 205, that were previously provided by the user (e.g., via user interface 400 of FIG. 4). Additionally, or alternatively, TCE 210 may provide, for display on computing device 205, user interface 400, via which the report settings may be entered by the user and received by TCE 210.

As further shown in FIG. 5, if a tag is to be associated with the report (block 520—YES), process 500 may include generating the tag (block 525). For example, TCE 210 may, based on the report settings, determine whether a tag is to be associated with the report. When the report settings indicate that a tag is to be associated with the report (e.g., based on information received via field 420 of FIG. 4), TCE 210 may generate a type of tag identified by the report settings. For example, TCE 210 may generate a string of characters when the report settings specify the string of characters; a bar code when the report settings specify the bar code; a QR code when the report settings specify the QR code; and/or some other tag specified by the report settings. Additionally, or alternatively, TCE 210 may communicate with a server device and/or an application stored on computing device 205 to access a service associated with providing tags. TCE 210 may, as a result of the communication, obtain a type of tag as specified by the report settings.

Additionally, or alternatively, TCE 210 may generate the tag in a number of ways based on information associated with the model element (e.g., a model element name, identifier, etc.), information associated with a physical element (e.g., a physical element name, identifier, etc.) with which the model element corresponds, etc. For example, TCE 210 may generate the tag using an encoding mechanism that encodes the name, identifier, etc. associated with the model element and/or the physical element. The encoding mechanism may, for example, generate the tag, based on the name, identifier, etc., using a hash function (e.g., a Bernstein hash function, a secure hash algorithm (SHA), etc.) and/or some other mathematical function. The encoding mechanism may also, or alternatively, generate the tag in a manner that is not based on the name, identifier, etc. (e.g., based on a random number, etc.).

As yet further shown in FIG. 5, process 500 may include associating the tag with a block to which the physical element corresponds (block 530). For example, TCE 210 may associate the tag with information associated with block 125 that is selected by the user and/or identified in the request to generate the report. Additionally, or alternatively, TCE 210 may associate the tag with information associated with a physical element with which block 125 is associated. TCE 210 may, for example, store the tag in a first field, within in a data structure (e.g., data structure 600 of FIG. 6), that is associated with a second field in which information, associated with block 125, is stored and/or a third field in which information, associated with the physical element, is stored.

For example, as shown in FIG. 6, data structure 600 may include a collection of fields, such as a model information field 605, a system information field 610, a model element field 615, a physical element field 620, and a tag field 625. The particular fields, shown with respect to data structure 600, are included for explanatory purposes. In another implementation, data structure 600 may include additional fields, fewer fields, different fields, or differently arranged fields than are depicted with respect to FIG. 6.

Model information field 605 may store information associated with a particular model (e.g., a model name, a model identifier, etc.). System information field 610 may store information associated with a particular system (e.g., a system name, a system identifier, etc.) that can be simulated by the particular model identified in model information field 605.

Model element field 615 may store information associated with a model element (e.g., a block 125, connector 127, etc.) associated with the particular model. For example, model element field 615 may store information that identifies a model element (e.g., a block identifier, a connector identifier, etc.), parameters that are used to execute the model element to simulate a physical element (e.g., values associated with performance forces, torques, velocities, accelerations, voltages, currents, pressures, volume flows, power levels, physical dimensions, weights, etc.), and/or lines of code that may be executed to simulate the behavior of the physical element. Additionally, or alternatively, model element field 615 may store information that identifies a model level, of a hierarchy of model levels (e.g., level 1, level 2, etc.) associated with the particular model. For example, model element field 615 may store an indication that a block is associated with a first model level. Model element field 615 may also, or alternatively, store information that indicates that one or more other model elements, on which the model element is based, are associated with a second level, etc.

Physical element field 620 may store information associated with a physical element corresponding to the particular system identified by system information field 610. For example, the information, associated with the physical element, may identify weights and/or dimensions of the physical element (e.g., weight, center of gravity, length, width, height, moment of inertia, etc.); materials on which the physical element is based (e.g., a metal alloy, a composite material, etc.); internal and/or external components of the physical elements (e.g., spars, struts, skin panels, electrical components, fluids, hydraulics components, screws and fasteners, etc.), interfaces with other physical elements (e.g., mechanical junctions, control junctions, electrical connectors, hydraulic connectors, etc.); performance limits (e.g., values associated with load limits, current limits, movement envelopes, flex limits, temperature limits, etc.); etc.

Tag field 625 may store a tag associated with the model element of model element field 615 and/or physical element field 620. The tag may, for example, correspond to a string of characters, a bar code, a QR code, etc.

Thus, TCE 210 may generate the tag (e.g., tag 1) and may store the tag in tag field 625 that is associated with a model element, identified by model element field 615, within a first model level (e.g., block 1/L1). Additionally, or alternatively, TCE 210 may store the tag in tag field 625 that is associated with a physical element, identified by physical element field 620 (e.g., PE 1), for which the report is to be generated.

Returning to FIG. 5, if the tag is not to be associated with the report (block 520—NO) or after associating the tag with the block to which the physical element corresponds (block 530), process 500 may include generating report information with which to create the report based on the report settings, the physical element, or the tag (block 535). For example, TCE 210 may, based on the report settings, determine that the tag is not to be associated with the report. When the report settings indicate that the tag is not to be associated with the report, TCE 210 may not generate the tag or communicate with a server device to obtain the tag.

Based on a determination that the tag is not to be associated with the report or after associating the tag with block 125, TCE 210 may generate report information to be used to generate the report. The report information may be generated based on information associated with the physical element, information associated with the model element, report settings, etc. For example, TCE 210 may, based on the report settings, identify a type of report that is to be generated (e.g., a 2D physical representation, a physical structure, a 2D image, a spatial representation, etc.). Based on the type of report that is to be generated and/or the report settings, TCE 210 may identify aesthetic features associated with the report, such as colors (e.g., associated with text, all or part of the physical element, block 125, a report background, etc.); text annotations (e.g., titles, labels, etc.); a manner in which the tag (e.g., if a tag was generated) is to be included with the report (e.g., by printing, by inscribing, by embedding, via a decal, etc.); etc. TCE 210 may also, or alternatively, identify one or more perspectives to be used to generate the report and/or a scale to be used to generate the report based on the report settings. Generating the report information will be described in greater detail below with respect to FIG. 7.

As further shown in FIG. 5, process 500 may include providing an instruction to create the report based on the report information (block 540). For example, TCE 210 may, based on the type of report to be generated provide an instruction to generate the report based on the report information. When the type of report corresponds to a 2D physical representation, TCE 210 may provide an instruction to 2D printing device 220 to generate the 2D physical representation based on the report information. In this example, the report information may be converted to a first format and/or protocol that can be received and/or processed by 2D printing device 220. 2D printing device 220 may receive the instruction and may generate the 2D physical representation based on the report information.

When the type of report corresponds to a physical structure, TCE 210 may provide an instruction to 3D printing device 230 to generate the physical structure based on the report information. In this example, the report information may be converted to a second format and/or protocol that can be received and/or processed by 3D printing device 230. 3D printing device 230 may receive the instruction and may generate the physical structure based on the report information.

When the type of report corresponds to the 2D image, TCE 210 may convert the report information to a third format and/or protocol that can be displayed on a display device associated with computing device 205. When the type of report corresponds to the spatial image (e.g., a stereoscopic image, a multiscopic image, a holographic image, etc.), TCE 210 may convert the report information to a fourth format and/or protocol that can be displayed on the display device and/or some other display device, such as a 3D display device (e.g., a volumetric display that can display image in three physical dimensions) and/or in free space.

Figure 7:
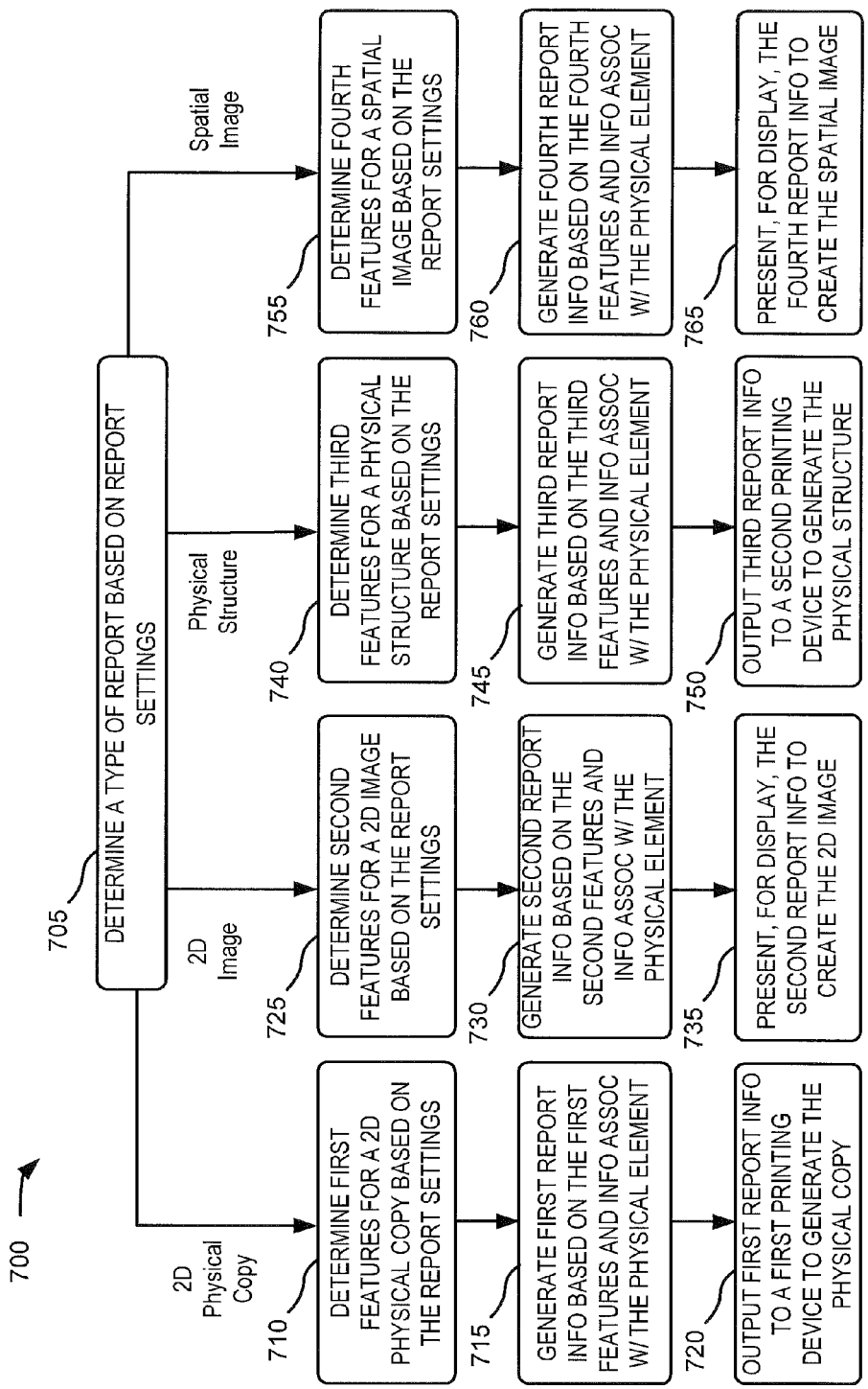
FIG. 7 is a flow chart of an example process for generating different types of two-dimensional and/or three-dimensional reports.

FIG. 7 is a flow chart of an example process 700 for generating different types of 2D reports and/or 3D reports. Process 700 may correspond to block 535 of FIG. 5. In one implementation, process 700 may be performed by computing device 205. Additionally, or alternatively, process 700 may be performed by a device, or group of devices, separate from, or in combination with, computing device 205.

As shown in FIG. 7, process 700 may include determining a type of report to be generated (block 705). For example, computing device 205 may obtain report settings, in a manner similar to that described above with respect to block 515 of FIG. 5, and may identify whether a 2D physical representation, a 2D image, a physical structure, and/or a spatial image is to be generated based on the report settings.

As also shown in FIG. 7, when a 2D physical representation is to be generated, process 700 may include determining first features for a 2D physical representation based on the report settings (block 710). For example, TCE 210 may, in a manner similar to that described above with respect to block 535 of FIG. 5, identify colors to be used to print text, depict all or part of a physical element, print block 125, print background, etc., associated with the 2D physical representation. TCE 210 may also, or alternatively, identify text annotations (e.g., titles, labels, etc.) to be printed in the 2D physical representation and/or determine whether a tag (if a tag was generated) is to be printed on the 2D physical representation or as a decal that can be attached to the 2D physical representation.

TCE 210 may also, or alternatively, identify one or more perspectives (e.g., a zero-point, a one-point, a two-point, a three-point, etc. perspective) and/or a scale to be used to generate the 2D physical representation. TCE 210 may also determine one or more viewing angles that a physical element is to be printed, in the 2D physical representation, based on the report settings. For example, TCE 210 may determine a range of elevation angles (e.g., from θ1 to θ2) relative to a first axis (e.g., a X-axis), a range of azimuth angles (e.g., from γ1 to γ2) relative to a second axis (e.g., a Y-axis), a range of roll angles (e.g., from α1 to α2) relative to a third axis (e.g., a Z-axis) (e.g., where the X-axis, Y-axis and Z-axis are orthogonal to each other). By way of example, TCE 210 may identify a range of elevation angles (e.g., from 0 degrees to 20 degrees, or some other range of elevation angles) and/or an elevation angle step size (e.g., Δθ) within the range of elevation angles (e.g., Δθ=0.1 degree, 0.5 degrees, 1.0 degree, 2.0 degrees, 5 degrees, 10.0 degrees, etc.). TCE 210 may also, or alternatively identify a range of azimuth angles (e.g., from 10 degrees to 14 degrees, or some other range of azimuth angles) and/or an azimuth angle step size (e.g., Δφ) within the range of azimuth angles (e.g., Δφ=0.1 degree, 0.5 degrees, 1.0 degree, 2.0 degrees, 5 degrees, 10.0 degrees, etc.). TCE 210 may also, or alternatively identify a range of roll angles (e.g., from 90 degrees to 110 degrees, or some other range of roll angles) and/or a roll angle step size (e.g., Δα) within the range of roll angles (e.g., Δα=0.1 degree, 0.5 degrees, 1.0 degree, 2.0 degrees, 5 degrees, 10.0 degrees, etc.).

As further shown in FIG. 7, process 700 may include generating first report information based on the first features and/or information associated with the physical element (block 715) and outputting the first report information to a first printing device to generate the 2D physical representation (block 720). For example, TCE 210 may retrieve, from the data structure, information, associated with a physical element, based on the perspective identified by the report settings. Additionally, or alternatively, TCE 210 may retrieve information, associated with the physical element, that conforms to each viewing angle (e.g., each increment within the ranges of elevation, azimuth, and/or roll) specified by the report information.

If information, associated with the physical element, is not stored, within the data structure, in a format that conforms to the identified perspective and/or to one or more of the viewing angles, TCE 215 may generate information, associated with the physical element, that conforms to the identified perspective and/or viewing angles. TCE 210 may also, or alternatively, generate first report information, to be used to print the 2D physical representation, based on the information associated with the physical element (e.g., based on each perspective, viewing angle, scale, etc.), information associated with the aesthetic features (e.g., colors, text annotations, a tag (if the tag was generated), etc.) and/or other information to be included within the 2D physical representation (e.g., block 125, parameters associated with block 125, etc.).

TCE 210 may provide the first report information to 2D printing device 220. 2D printing device 220 may receive the first report information and may print one or more 2D physical representations based on the first report information. For example, 2D printing device 220 may generate a respective 2D physical representation (e.g., on a paper media, on plastic media (transparency), etc.) based on each perspective and/or increment of a viewing angle, associated with the physical element, identified by the first report information. The respective 2D physical representation may conform to the scale, aesthetic features, etc. identified by the first report information. Additionally, or alternatively, the respective 2D physical representation may include a tag if the tag is included within the first report information.

As also shown in FIG. 7, when a 2D image is to be generated, process 700 may include determining second features for the 2D image based on the report settings (block 725). For example, TCE 210 may, in a manner similar to that described above, with respect to block 535 of FIG. 5, identify colors to be used to display text, depict all or part of a physical element, display block 125, display a background, etc., associated with the 2D image. TCE 210 may also, or alternatively, identify text annotations (e.g., titles, labels, parameter values, etc.) to be displayed in the 2D image and/or determine whether a tag (if a tag was generated) is to be displayed within the 2D image.

TCE 210 may also, or alternatively, identify one or more perspectives (e.g., a zero-point, a one-point, a two-point, a three-point, etc. perspective) and/or a scale to be used to display the 2D image. TCE 210 may, in a manner similar to that described above with respect to block 715, determine one or more view angles (e.g., based on a range of elevation angles, azimuth angles, and/or roll angles) and/or view angle increments (e.g., $\Delta\theta$, $\Delta\phi$, and/or $\Delta\alpha$) that the physical element can be displayed, via the 2D image, based on the report settings. Additionally, or alternatively, TCE 210 may determine the viewing angles independent from the report settings. For example, TCE 210 may determine the range of viewing angles, on a near real-time basis, in response to instructions received from a user of computing device 205, while the 2D image is being displayed. A viewing angle increment may, in this example, be based on an available processing capacity of computing device 205, a rate of change of viewing angle requested from the user while the 2D image is being displayed, and/or or some other rate of change of the viewing angle.

As further shown in FIG. 7, process 700 may include generating second report information based on the second features and/or information associated with the physical element (block 730) and presenting, for display, the second report information to create the 2D image (block 735). For example, TCE 210 may retrieve, from the data structure, information, associated with physical element, based on the perspective identified by the report settings. Additionally, or alternatively, computing device 205 may retrieve information, associated with the physical element, that conforms to a viewing angle specified by the report settings.

If information, associated with the physical element, is not stored, within the data structure, in a format that conforms to the identified perspective and/or the viewing angle, TCE 215 may generate information, associated with the physical element, that conforms to the identified perspective and/or the viewing angle. TCE 210 may generate second report information, to be used to display the 2D image, based on the information associated with the physical element (e.g., based the perspective, the viewing angle, the scale, etc.), information associated with the aesthetic features (e.g., colors, text annotations, a tag (if the tag was generated), etc.) and/or other information to be included within the 2D image (e.g., block 125, parameters associated with block 125, etc.).

TCE 210 may present, for display on a display device associated with the computing device 205, the 2D image based on the second report information. The 2D image may be displayed in a manner that conforms to the scale, aesthetic features, etc. identified by the second report information. Additionally, or alternatively, the 2D image may include a tag if the tag is included within the second report information.

TCE 210 may receive, from the user, an instruction to change from a first viewing angle to a second viewing angle associated with the 2D image. TCE 210 may, in response to the request, retrieve and/or generate information associated with the physical element that conforms to the second viewing angle and may present, for display, the information associated with the physical element that conforms to the second viewing angle. Additionally, or alternatively, TCE 210 may present, for display, information associated with the physical element at one or more incremental viewing angles between the first viewing angle and the second viewing angle in a manner that causes the 2D image to appear as though there is a continuous change in viewing angle.

As also shown in FIG. 7, when a physical structure is to be generated, process 700 may include determining third features for the physical structure based on the report settings (block 740). For example, TCE 210 may, in a manner similar to that described above, with respect to block 535 of FIG. 5, identify colors to be used for text and/or for one or more base materials associated with a physical structure. TCE 210 may also, or alternatively, identify text annotations (e.g., titles, labels, parameter values, etc.) and/or a tag (if a tag was generated) to be included on the physical structure (e.g., by printing, by inscribing, by embedding, via a decal, etc.). TCE 210 may also, or alternatively, identify a scale to be used to generate the physical structure based on all or a portion of the physical element. TCE 210 may also, or alternatively, identify a base material (e.g., plastic, ceramic, metal, etc.) on which the physical structure is to be based. TCE 210 may identify which 3D printing device 230 to be used to generate the physical structure based on the identified base material.

As further shown in FIG. 7, process 700 may include generating third report information based on the third features and/or information associated with the physical element (block 745) and outputting third report information to a second printing device to generate the physical structure (block 750). For example, TCE 210 may retrieve, from the data structure, information, associated with physical element (e.g., that identifies dimensions, exterior surface geometry, internal structure geometry, etc.) that enables a physical structure, that represents a copy of the physical element in three spatial dimensions, to be generated.

If TCE 210 determines that the information, associated with the physical element, is not stored within the data structure, TCE 215 may generate or retrieve the information associated with the physical element. TCE 210 may generate third report information, to be used to generate the physical structure, based on the information associated with the physical element, a scale, a type of base material, information associated with the aesthetic features (e.g., colors, text annotations, a tag (if the tag was generated), etc.), etc.

TCE 210 may provide the third report information to 3D printer device 230 that is capable of generating the physical structure using the base material identified by the third report information. 3D printing device 230 may receive the third report information and may generate the physical structure based on the third report information. For example, 3D printing device 230 may generate the physical structure in a manner that conforms to the color, the scale, the aesthetic features, etc. identified by the third report information. Additionally, or alternatively, 3D printing device 230 may print, inscribe, and/or embed a tag on and/or within the based material of the physical structure if the tag is included within the third report information.

As also shown in FIG. 7, when a spatial image is to be generated, process 700 may include determining fourth features for the spatial image based on the report settings (block 755). For example, TCE 210 may, in a manner similar to that described above, with respect to block 535 of FIG. 5, identify colors to be used to display text, depict all or part of a physical element, display block 125, display a background, etc., associated with the spatial image. TCE 210 may also, or alternatively, identify text annotations (e.g., titles, labels, parameter values, etc.) to be displayed in the spatial image and/or determine whether a tag (if a tag was generated) is to be displayed within the spatial image.

TCE 210 may also, or alternatively, identify one or more perspectives (e.g., a zero-point, a one-point, a two-point, a three-point, etc. perspective) and/or a scale to be used to display the spatial image. TCE 210 may, in a manner similar to that described above with respect to block 715, determine one or more view angles (e.g., based on a range of elevation angles, azimuth angles, and/or roll angles) and/or view angle increments (e.g., $\Delta\theta$, $\Delta\phi$, and/or $\Delta\alpha$) that the physical element can be displayed, via the spatial image, based on the report settings. Additionally, or alternatively, TCE 210 may determine the viewing angles independent from the report settings. TCE 210 may, for example, identify the range of viewing angles, on a near real-time basis, in response to instructions received from a user of computing device 205, while the spatial image is being displayed. A viewing angle increment may, in this example, be based on an available processing capacity of computing device 205, a rate of change of viewing angle requested from the user while the spatial image is being displayed, and/or or some other rate of change of the viewing angle.

As further shown in FIG. 7, process 700 may include generating fourth report information based on the fourth features and/or information associated with the physical element (block 760) and presenting, for display, the fourth report information to create the spatial image (block 765). For example, TCE 210 may retrieve, from the data structure, information, associated with physical element, based on the perspective identified by the report settings. Additionally, or alternatively, TCE 210 may retrieve information, associated with the physical element, that conforms to a viewing angle specified by the report settings. In one example, TCE 210 may retrieve information, associated with the physical element, that corresponds to two or more viewing angles. The two or more viewing angles may be used, by TCE 210, to represent the spatial image from a particular viewing angle. The two or more viewing angles may, in this example, be used to generate a stereoscopic representation of the physical element (e.g., when two viewing angles are used) and/or a multiscopic or holographic representation of the physical element (e.g., when two or more viewing angles are used).

If information, associated with the physical element, is not stored, within the data structure, in a format that conforms to the identified perspective and/or particular viewing angles that enable the stereoscopic, multiscopic, and/or holographic representations to be generated, TCE 215 may generate information, associated with the physical element, that conforms to the identified perspective and/or the particular viewing angles. Additionally, or alternatively, TCE 210 may associate a respective different polarization, frequency, and/or phase with information associated with the physical element that conforms to each of the particular viewing angles. The different polarization, frequencies, and/or phases may cause portions of the spatial image to appear in three spatial dimensions to a user, of computing device 205, when the information, associated with the physical element, is displayed on a display device based on the different polarizations, frequencies, and/or phases.

TCE 210 may generate fourth report information, to be used to display the spatial image, based on the information associated with the physical element (e.g., based on the perspective, the particular viewing angles, the scale, etc.), information associated with the aesthetic features (e.g., colors, text annotations, a tag (if the tag was generated), etc.) and/or other information to be included within the spatial image (e.g., block 125, parameters associated with block 125, etc.).

TCE 210 may present, for display on a display device associated with the computing device 205, the spatial image based on the fourth report information. The spatial image may be displayed in a manner that conforms to the scale, aesthetic features, the particular viewing angles, etc. identified by the fourth report information. Additionally, or alternatively, the spatial image may include a tag if the tag is included within the fourth report information.

TCE 210 may receive, in a manner similar to that described above with respect to block 735, from the user, an instruction to navigate the spatial image by changing a zoom state (e.g., by zooming in or zooming out) and/or by changing a viewing angle of the spatial image. Computing device 205 may, in response to the request, retrieve and/or generate information, associated with the physical element, that conforms to the change in the zoom state and/or the viewing angle. Additionally, or alternatively, computing device 205 may present, for display, information associated with the physical element at one or more incremental zoom states and/or viewing angles in a manner that causes the spatial image to appear as though there is a continuous change in zoom state and/or viewing angle.

Figure 8:
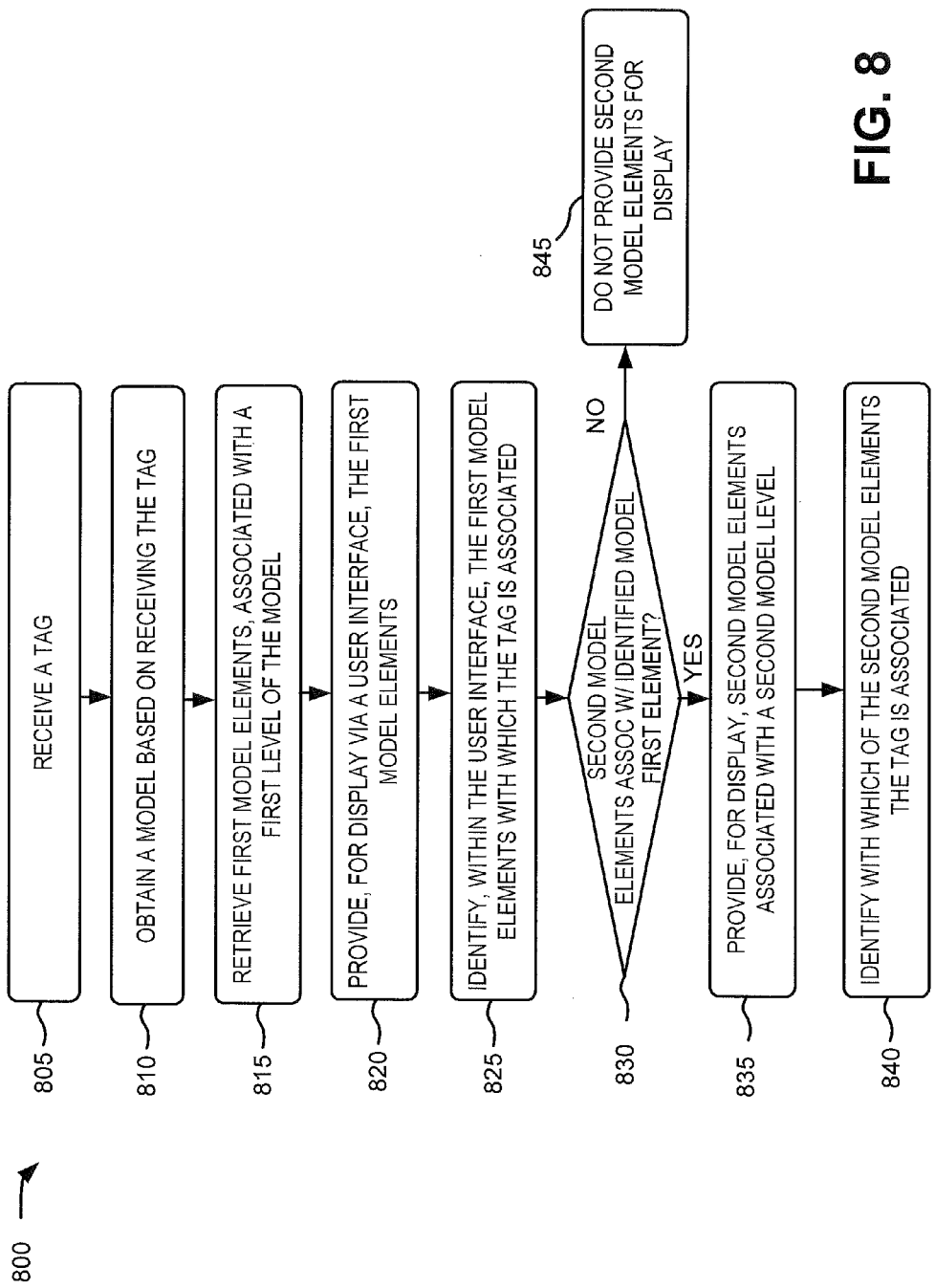
FIG. 8 is a flow chart of an example process for navigating a model, via a user interface, based on a received tag.
Figure 9:
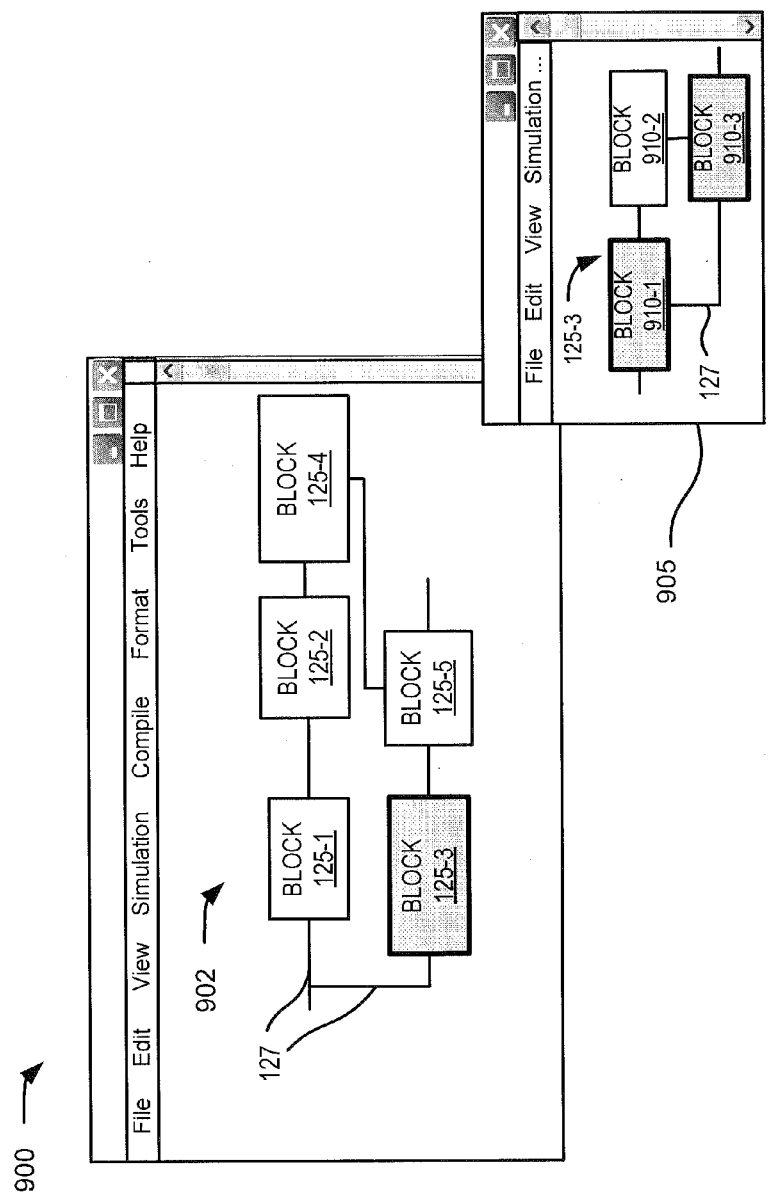
FIG. 9 is a diagram of example user interfaces depicting different levels of a model.

FIG. 8 is a flow chart of an example process 800 for navigating a model, via a user interface, based on a received tag. In one implementation, process 800 may be performed by computing device 205. Additionally, or alternatively, process 800 may be performed by a device, or group of devices, separate from, or in combination with, computing device 205. FIG. 9 is a diagram of example user interfaces 900 and 905 depicting different levels of a model. In the description below, all or a portion of process 800 will be described with references to user interfaces 900 and 905 of FIG. 9.

As shown in FIG. 8, process 800 may include receiving a tag (block 805) and obtaining a model based on receiving the tag (block 810). For example, a user, of computing device 205, may obtain a tag from a spatial representation, such as a 2D physical representation, a physical structure, or from a display device on which a 2D image and/or a spatial image is being display. The user may provide the tag to computing device 205. In one example, when the tag corresponds to a string of characters, a bar code, etc., the user may manually provide the tag to computing device 205 (e.g., via a user interface, using a key board, etc.) and computing device 205 may receive the tag. Additionally, or alternatively, the user may use user device 215 to scan the tag (e.g., the string of characters, the bar code, a QR code, etc.) from the spatial representation and may cause user device 215 to transmit the tag to computing device 205. Computing device 205 may receive the tag from user device 215. Additionally, or alternatively, the user may use computing device 205 to scan the tag.

Computing device 205 may, as a result of receiving the tag, use TCE 210 to identify a model with which the tag is associated. For example, TCE 210 may identify a tag, stored within a data structure (e.g., field 625 of FIG. 6), that matches the received tag. Additionally, or alternatively, TCE 210 may obtain, from the data structure (e.g., field 605 of FIG. 6), information that identifies a model with which the stored tag is associated. TCE 210 may retrieve and/or open the model based on the information that identifies the model.

As also shown in FIG. 8, process 800 may include retrieving first model elements, associated with a first level of the model (block 810). For example, TCE 210 may identify a first model element (e.g., block 125), stored within the data structure, that is associated with the identified model. Additionally, or alternatively, TCE 210 may identify the first model element, stored within the data structure (e.g., field 615 of FIG. 6), that corresponds to the stored tag. Additionally, or alternatively, TCE 210 may identify other first model elements (e.g., other blocks 125 and/or connectors 127) with which the first model element communicates and/or that are associated with a same model level (e.g., a first model level) as the first model element. TCE 210 may retrieve information, associated with the first model element and/or the other first model elements, from the data structure.

Additionally, or alternatively, as a result of receiving the tag, computing device 210 may retrieve a file, from a memory associated with computing device 210, associated with the tag. Computing device 210 may identify an application, with which the retrieved file is associated, and may open the application to access information associated with the first model element and/or the other first model elements.

As further shown in FIG. 8, process 800 may include providing, for display via a user interface, the first model elements (block 820) and identifying, within the user interface, the first model element with which the tag is associated (block 825). For example, TCE 210 may provide a user interface for display on a display device associated with computing device 205. TCE 210 may also present for display, via the user interface, the first model element with which the tag is associated. Additionally, or alternatively, TCE 210 may present, for display via the user interface, the other first model elements.

Additionally, or alternatively, TCE 210 may cause the first model element, with which the tag is associated, to be identified within the user interface. In one example, TCE 210 may identify the first model element by causing an appearance (e.g., a color, a line thickness, a pattern, a font, etc.), of the first model element, to change with respect to an appearance of the other first model elements.

For example, as shown in FIG. 9, user interface 900 may include a collection of model elements, such as a set of blocks 125-1 through 125-5 and a set of connectors 127 associated with a model 902. The set of blocks 125 and/or connectors 127 may, for example, correspond to a first model level of model 902. TCE 210 may cause block 125-3 to be provided for display, via user interface 900, based on the determination that the tag is associated with block 125-3. TCE 210 may also, or alternatively, cause other blocks 125 (e.g., blocks 125-1, 125-2, 125-4, and/or 125-5) and/or connectors 127 to be provided for display, for example, based on a determination that the other blocks 125 and/or connectors 127 are associated with a same model level as block 125-3 and/or corresponds to model elements with which block 125-3 communicates. TCE 210 may also, or alternatively, cause block 125 to change in appearance (e.g., shown as shaded block 125-3) relative to the other blocks 125 based on the tag being associated with block 125-3.

As further shown in FIG. 8, if second model elements are associated with the identified first model element (block 830—YES), process 800 may include providing, for display, the second model elements associated with a second model level (block 835) and identifying with which of the second model elements the tag is associated (block 840). For example, TCE 210 may determine whether the first model element is based on one or more second model elements (e.g., as sub-model elements of the first model element). In this example, the second model elements may correspond to components of a physical element with which the first model element is associated. When the first model element is based on the one or more second model elements, TCE 210 may retrieve the second model elements and may display the second model elements on computer device 205. In one example, TCE 210 may provide the second model elements for display via the user interface used to display the first model elements. Additionally, or alternatively, TCE 210 may cause another user interface to be displayed and may provide the second model elements for display via the other user interface.

Additionally, or alternatively, computing device 205 may, in a manner similar to that described above, cause one or more of the second model elements, with which the tag is associated, to change appearance (e.g., a color, a line thickness, a pattern, a font, etc.), with respect to an appearance of the other second model elements.

For example, as shown in FIG. 9, user interface 905 may correspond to a second model level associated with model 902. User interface 905 may include a collection of second model elements, such as a set of blocks 910-1 through 910-3 (hereinafter referred to collectively as "blocks 910" and individually as "block 910") and a set of connectors 127 that logically connect blocks 910. The set of blocks 910 and/or connectors 127 may correspond to model elements on which the first model element (e.g., block 125-3) is based. TCE 210 may, in a manner similar to that described above, identify one or more blocks 910 that are associated with the tag and may cause the identified blocks 910 to change in appearance (e.g., shown as shaded blocks 910-1 and 910-3) relative to the other blocks 910 within user interface 905.

As further shown in FIG. 8, if second model elements are not associated with the identified first model element (block 830—NO), process 800 may not provide second model elements for display (block 845). For example, TCE 210 may determine that the first model element is not based on the one or more second model elements. When the first model element is not based on the one or more second model elements, TCE 210 may not retrieve the second model elements and/or may not display the second model elements on computer device 205.

Figure 10:
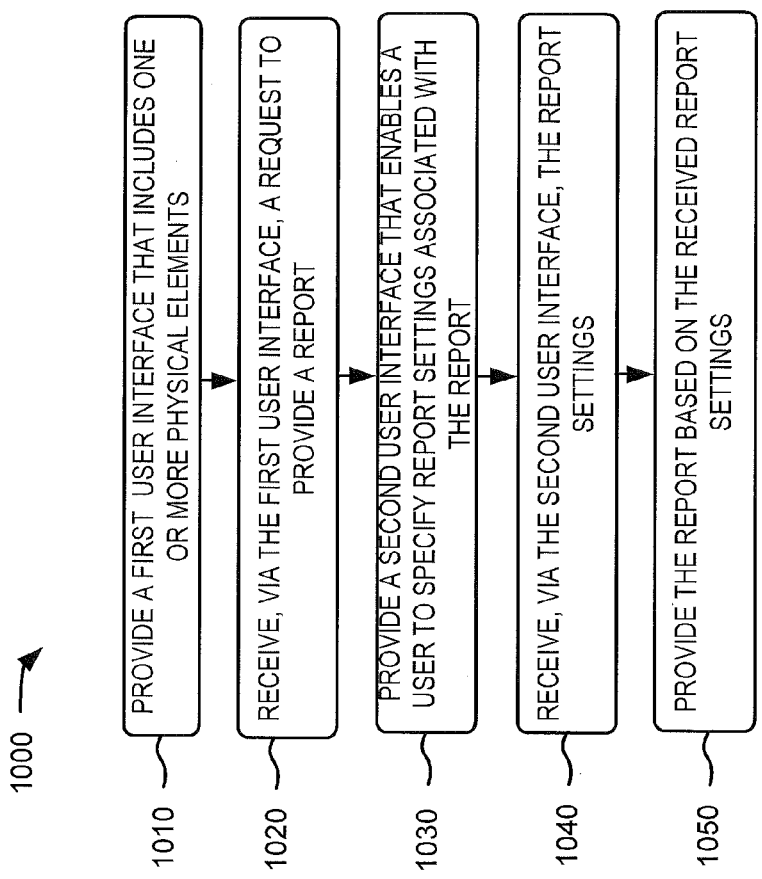
FIG. 10 is a flow chart of an example process for printing a two-dimensional and/or three-dimensional report based on of one or more physical element depicted via a user interface.
Figure 11:
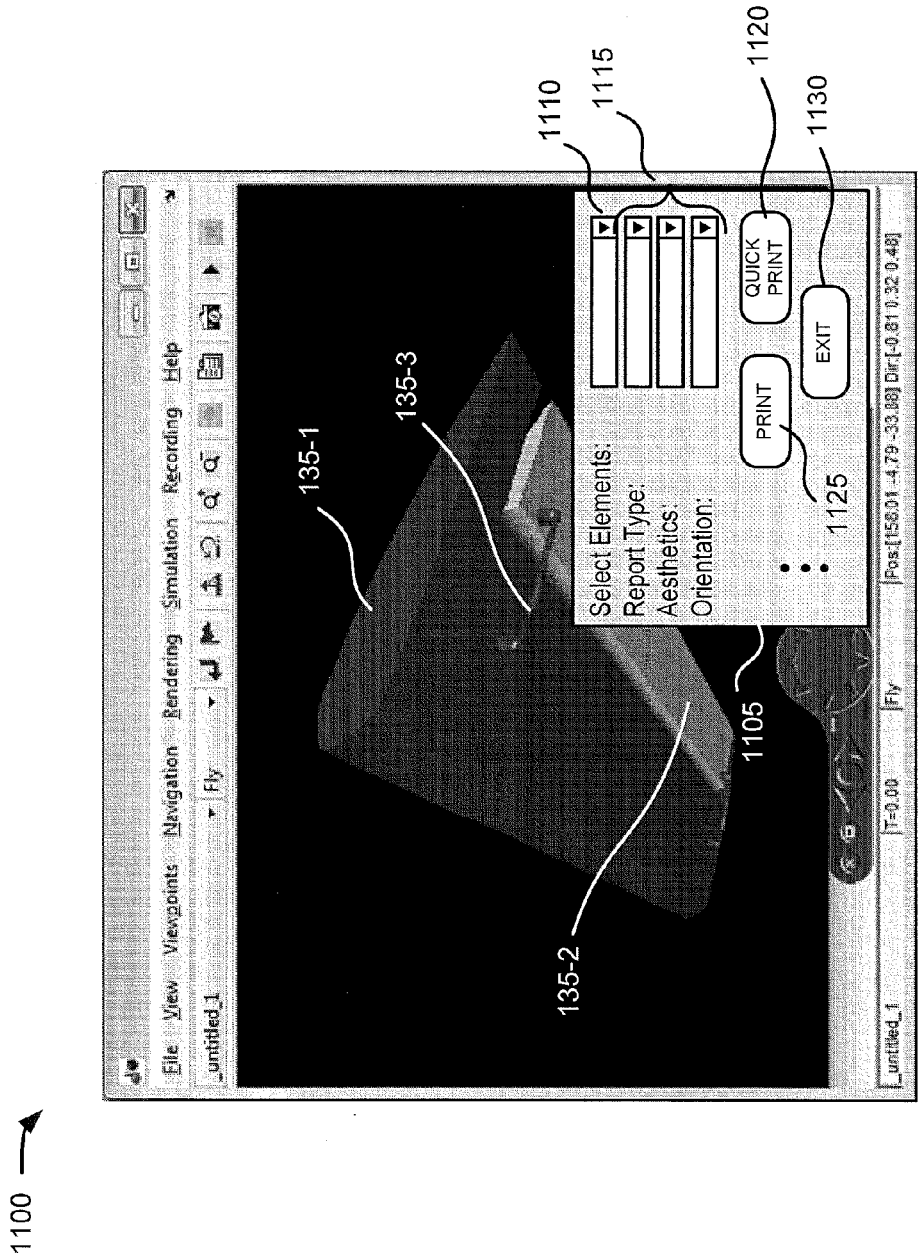
FIG. 11 is an example user interface depicting one or more physical elements.

FIG. 10 is a flow chart of an example process 1000 for printing a 2D report and/or a 3D report based on a physical element depicted via a user interface. In one implementation, process 1000 may be performed by computing device 205. Additionally, or alternatively, process 1000 may be performed by a device, or group of devices, separate from, or in combination with, computing device 205. FIG. 11 is an example user interface 1100 depicting one or more physical elements. In the description below, all or a portion of process 1000 will be described with references to user interfaces 1100 of FIG. 11.

As shown in FIG. 10, process 1000 may include providing a first user interface that includes one or more physical elements (block 1010) and receiving, via the user interface, a request to provide a report (block 1020). For example, TCE 210 may provide a user interface that depicts one or more physical elements associated with a system. The one or more physical elements may be associated with one or more model elements, that when executed by TCE 210, simulate behavior of the physical elements. The user may interact with the user interface to cause TCE 210 to provide a menu that includes a list of commands (e.g., by right-clicking a pointing device, by pressing a particular key on a keyboard, etc.) that allows the user to instruct TCE 210 to perform some act. TCE 210 may provide the menu that includes the list of commands (e.g., save, exit, print, copy, paste, etc.) and the user may select a print command from the list of commands. TCE 210 may receive, via the user interface, an instruction to print a report (e.g., a 2D report and/or a 3D report) based on selection of the print command.

As also shown in FIG. 10, process 1000 may include providing a second user interface that enables the user to specify report settings associated with the report (block 1030) and receiving, via the second user interface, the report settings (block 1040). For example, TCE 210 may, as a result of the instruction, provide a second user interface that enables the user to specify report settings to be used to generate the report.

For example, as shown in FIG. 11, user interface 1100 may depict a set of physical elements 135-1-135-3 associated with a system. TCE 210 may, for example, display user interface 1100 on a display device, which may enable one or more physical elements 135 to be rotated (e.g., in azimuth, elevation, roll, etc.), zoomed in or out, and/or animated (e.g., movement of one physical element 135 relative to another physical element 135) based on instructions from a user and/or during a simulation. As described above, the user may interact with user interface 1100 to instruct TCE 210 to provide a report associated with one or more of the physical elements 135. TCE 210 may, for example, as a result of the instruction, provide user interface 1105. User interface 1105 may include a select elements field 1110, report settings fields 1115, a quick print button 1120, a print button 1125, and an exit button 1130. In one example, user interface 1105 may include one or more of the fields and/or buttons shown with respect to user interface 400 of FIG. 4. The particular fields and/or buttons, included in user interface 1105, are shown for explanatory purposes. In another implementation, there may be additional fields and/or buttons, fewer fields and/or buttons, different fields and/or buttons, and/or differently arranged fields and/or buttons that are shown with respect to FIG. 11.

Select element field 1110 may enable the user to enter or select (e.g., from a pull-down menu) one, some, or all of the physical elements 135 for which to generate a report. In one example, select element field 1110 may be pre-populated when the user selects a particular physical element 135 (e.g., by selecting with a pointing device, by right-clicking on a physical element with a pointing device, etc.) depicted within user interface 1100. Reporting settings fields 1115 may, in a manner described above with respect to FIG. 4, enable the user to enter and/or select one or more report settings, such as a type of report, aesthetic features of the report (e.g., one or more colors, text annotations, a tag annotations, etc.,), orientation of the report (e.g., scale, perspectives, viewing angle, etc.), etc.

Quick print button 1120 may, when selected by the user, instruct TCE 210 to cause a report, associated with one or more physical elements, to be printed based on default report settings, such as a default report type (e.g., a 2D image), default colors, a default tag type (e.g., a QR code), a default scale, a default perspective (e.g., a three-point perspective, etc.), etc. Print button 1125 may, when selected by the user, instruct TCE 210 to cause a report, associated with one or more physical elements 135, to be printed based on the report settings specified in report settings fields 1115. Exit button 1130 may cause TCE 210 to close user interface 1105 without causing a report to be generated.

Thus, the user may enter and/or select, via select elements field 1110, physical element 135 for which to print a report. The user may also, or alternatively, enter and/or select a model element, for which to print a report, that corresponds to the selected physical element 135. The user may also, or alternatively, enter and/or select via report settings field 1115, a report type, aesthetic features and/or an orientation of the report. The user may select print button 1125 and TCE 210 may receive the report settings via the second user interface. Additionally, or alternatively, the user may select quick print button 1120, which may cause TCE 210 to obtain default report settings with which to print the report.

As further shown in FIG. 10, process 1000 may include providing the report based on the report settings (block 1050). For example, TCE 210 may, in a manner similar to that described above with respect to FIG. 7, generate report information based on the report settings (or the default report settings), the information associated with the physical element, a tag (if a tag is specified by the report settings), etc. TCE 210 may also, or alternatively, cause the report to be generated, in a manner similar to that described above with respect to FIG. 7, based on the report information.

Figure 12A:
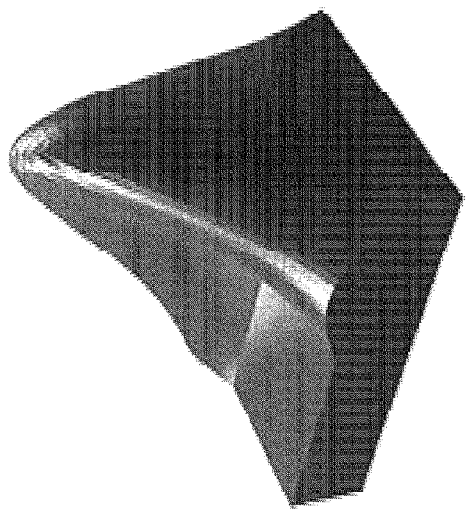
FIGS. 12A and 12B are example two-dimensional and/or three-dimensional reports, respectively.

FIG. 12A is an example 2D report 1200 that is generated by computing device 205 and/or TCE 210. As shown in FIG. 12A, 2D report 1200 may represent a 2D physical representation, of a physical element (e.g., associated with an L-shaped membrane resonance) that is printed, by 2D printing device 220, on a print media (e.g., paper, transparency, etc.). Additionally, or alternatively, 2D report 1200 may represent a 2D image, of the physical element, that is displayed on a display device associated with computing device 205.

Figure 12B:
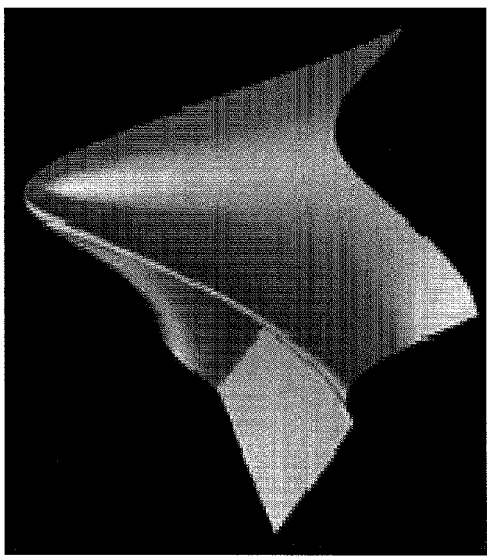

FIG. 12B is an example 3D report 1250 that is generated by computing device 205 and/or TCE 210. As shown in FIG. 12B, 3D report 1250 may represent a physical structure, of the physical element of FIG. 12A, that is generated, by 3D printing device 230, based on a volume of material (e.g., metal, plastic, ceramic, etc.).

Figures 13A, 13B:
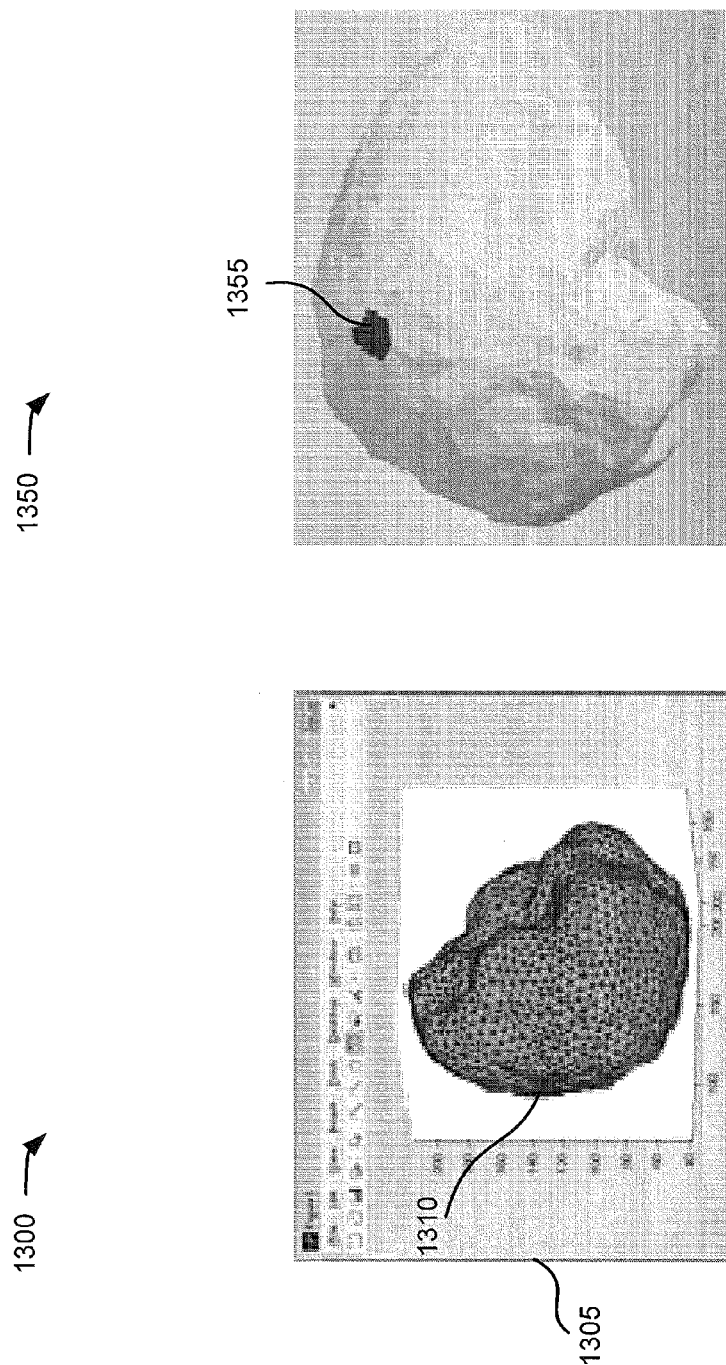
FIGS. 13A and 13B are other example two-dimensional and/or three-dimensional reports, respectively.

FIG. 13A is an example 2D report 1300 that is generate by computing device 205 and/or TCE 210. As shown in FIG. 13A, 2D report 1300 may represent a 2D physical representation, within a user interface 1305 associated with TCE 210, of a physical element (e.g., associated with a human brain) that is printed, by 2D printing device 220, on a print media (e.g., paper, transparency, etc.). Additionally, or alternatively, 2D report 1300 may represent a 2D image, of the physical element, that is displayed via user interface 1305. 2D report 1300 may, for example, include a feature 1310, corresponding to all or a portion of the physical element depicted by 2D report 1300, that is associated with an appearance (e.g., a color, a pattern, etc.) that distinguishes feature 1310 from other portions the physical element. Feature 1310 may, for example, represent a portion of the physical element that is of particular interest to a user of TCE 210 and/or that is being analyzed by a model associated with TCE 210.

FIG. 12B is an example 3D report 1250 that is generate by computing device 205 and/or TCE 210. As shown in FIG. 13B, 3D report 1350 may represent a physical structure, of the physical element of FIG. 13A, that is generated, by 3D printing device 230, based on a volume of material (e.g., metal, plastic, ceramic, etc.). 3D report 1350 may, for example, include a feature 1355, associated with all or a portion of the physical structure, that includes characteristics (e.g., colors, textures, material types, etc.) that distinguish feature 1355 from other portions the physical structure. Feature 1355 may, for example, represent a portion of the physical element that is of particular interest to a user of TCE 210 and/or that is being analyzed by a model associated with TCE 210.

Systems and/or methods, described herein, may enable a TCE that uses a model to simulate behavior of a system to cause a 2D representation and/or spatial representation, associated with a physical element within the modeled system, to be generated. The 2D representation, of the physical element, may correspond to a 2D physical representation, a 2D image, etc. The spatial representation, of the physical element, may correspond to a physical structure, a spatial image (e.g., as a stereoscopic representation, as a multiscopic representation, as a holographic representation, etc.), etc. The 2D representation and/or spatial representation may also, or alternatively, depict other information, such as model elements, parameters associated with the model elements, etc.

The systems and/or methods may enable the TCE to generate a tag and to associate the tag with a model element that, when executed, simulates behavior of the physical element. The TCE may generate a report (e.g., a 2D report and/or a 3D report), corresponding to the physical element, in a manner that includes the tag within a 2D physical representation, on a surface of a physical structure, embedded within a physical structure, within a 2D image, within a spatial image, etc. An operator, associated with the TCE, may obtain the tag from the report and may provide the tag to the TCE. The TCE may retrieve the model element with which the tag is associated and may provide the model element for display on the computing device. Retrieving the model element based on the tag may enable information associated with a model to be archived and/or easily retrieved based on the tag associated with report.

The foregoing description provides illustration and description, but is not intended to be exhaustive or to limit the description to the precise form disclosed. Modifications and variations are possible in light of the above embodiments or may be acquired from practice of the implementations.

While series of blocks have been described with regard to FIGS. 5, 7, 8, and 10, the order of the blocks may be modified in other embodiments. Further, non-dependent blocks may be performed in parallel.

It will be apparent that example aspects, as described above, may be implemented in many different forms of software, firmware, and hardware in the implementations illustrated in the figures. The actual software code or specialized control hardware used to implement these aspects should not be construed as limiting. Thus, the operation and behavior of the aspects were described without reference to the specific software code—it being understood that software and control hardware could be designed to implement the aspects based on the description herein.

Further, certain implementations may involve a component that performs one or more functions. These components may include hardware, such as an ASIC or a FPGA, or a combination of hardware and software.

Even though particular combinations of features are recited in the claims and/or disclosed in the specification, these combinations are not intended to limit disclosure of the possible implementations. In fact, many of these features may be combined in ways not specifically recited in the claims and/or disclosed in the specification. Although each dependent claim listed below may directly depend on only one other claim, the disclosure of the implementations includes each dependent claim in combination with every other claim in the claim set.

No element, act, or instruction used in the present application should be construed as critical or essential to the implementations unless explicitly described as such. Also, as used herein, the article "a" is intended to include one or more items. Where only one item is intended, the term "one" or similar language is used. Further, the phrase "based on" is intended to mean "based, at least in part, on" unless explicitly stated otherwise.

What is claimed is:

1. A method, comprising:
   obtaining a model that, when executed, simulates behavior of a dynamic system,
      the model including a plurality of model elements,
      the plurality of model elements corresponding to one or more physical elements associated with the dynamic system,
      the obtaining the model being performed by a first computing device,
      the first computing device being associated with a technical computing environment (TCE);
   receiving, based on obtaining the model, a request to generate a report associated with a physical element of the one or more physical elements,
      the report corresponding to a two-dimensional representation of the physical element or a spatial representation of the physical element,
      the receiving the request being performed by the first computing device;
   generating a tag, the tag including one or more symbols,
      the generating the tag being performed by the first computing device;
   associating the tag with a model element, of the plurality of model elements, that corresponds to the physical element,
      the associating the tag being performed by the first computing device;
   causing, based on the tag and information associated with the physical element, the report to be generated in a manner that includes the tag,
      the tag being located on, or within, the report,
      the causing the report to be generated being performed by the first computing device; and
   causing at least part of the model to be displayed, in the TCE, based on the tag,
      the at least part of the model including the model element associated with the tag,
      an appearance of the at least part of the model being altered to indicate that the model element is associated with the tag,
      the causing the at least part of the model to be displayed being performed by a second computing device.

2. The method of claim 1, where causing the at least part of the model to be displayed comprises:
   providing, for display in the TCE, the plurality of model elements; and
   causing an appearance, associated with the model element, to change relative to an appearance associated with other model elements, of the plurality of model elements, based on receiving the tag.

3. The method of claim 1, where causing the at least part of the model to be displayed comprises:
   providing, for display in the TCE, a user interface that includes the plurality of model elements; and
   causing the user interface to navigate to a portion of the model that includes the model element based on receiving the tag.

4. The method of claim 3, where causing the user interface to navigate to the portion of the model includes:
   determining a level of the model, of a plurality of levels associated with the model, with which the model element is associated; and
   providing, for display and via the user interface, one or more model elements, of the plurality of model elements, associated with the level of the model, the one or more model elements including the model element.

5. The method of claim 1, further comprising:
   receiving the tag after associating the tag with the model element;
   providing, for display on the second computing device, a user interface that depicts the one or more physical elements of the dynamic system; and
   causing the user interface to navigate to a portion of the dynamic system that includes the physical element based on receiving the tag.

6. The method of claim 5, where causing the user interface to navigate to the portion of the dynamic system includes at least one of:
   causing the user interface to zoom-in or out to a portion of the dynamic system that includes the physical element; or
   causing the user interface to change a viewing angle associated with the physical element.

7. The method of claim 1, where the report corresponds to at least one of:
   a two-dimensional physical representation, of the physical element, printed on a print medium,
   a two-dimensional image, of the physical element, displayed on a display device, a three-dimensional physical structure, of the physical element, based on a volume of material, or a three-dimensional spatial image, of the physical element, displayed on the display device.

8. The method of claim 7, where at least one of:

the two-dimensional image is based on a projection, of the physical element, on the display device, the projection corresponding to a particular angle relative to the physical element, or the three-dimensional spatial image is based on two or more projections, of the physical element, on the display device, the two or more projections corresponding to two or more angles relative to the physical element.

9. The method of claim 1, further comprising:

receiving the tag after associating the tag with the model element, the receiving the tag including at least one of:
scanning the one or more symbols on a surface of the spatial representation; or
receiving, via a user interface and from a user, of the second computing device, the one or more symbols.

10. The method of claim 9, further comprising:

retrieving, from a memory associated with the second computing device, the model element with which the one or more symbols are associated.

11. The method of claim 10, further comprising:

providing, for display via the user interface, information associated with the model element, the information associated with the model element including at least one of:
lines of code that, when executed, simulate behavior of the physical element,
parameters used to execute the model element, or
information that describes the physical element.

12. The method of claim 1, further comprising:

obtaining information that identifies features to be associated with the report,
the information that identifies the features being predetermined by the first computing device or being specified by a user of the first computing device, and
the information that identifies the features identifying at least one of:
a type of report that is to be generated,
one or more colors to be used to generate the report,
one or more labels to be included on the report,
a scale associated with the report,
a viewing angle associated with the report,
whether the tag is to be generated,
a type of tag that is to be generated,
whether the tag is to be embedded in the report,
whether the tag is to be included on the report, or
whether the tag is to be printed on a decal and attached to a surface of the report using an adhesive material; and
causing the report to be generated based on the information that identifies the features.

13. The method of claim 1, further comprising:

providing, for display on the first computing device, a user interface that depicts the one or more physical elements of the dynamic system;
receiving, via the user interface, selection of a particular physical element of the one or more physical elements;
generating a particular tag based on receiving the selection of the particular physical element;
associating the particular tag with a particular model element, of the plurality of model elements, that corresponds to the particular physical element; and causing, based on the particular tag and information associated with the particular physical element, a particular report to be generated in a manner that includes the particular tag.

14. The method of claim 1, further comprising:

receiving another tag, the other tag being associated with another report;
obtaining a file associated with the other tag, the file storing information associated with one or more model elements, of the plurality of model elements;
opening an application, with which the file is associated, to access the information associated with the one or more model elements; and
providing, for display on the second computing device, a user interface that includes the one or more model elements based on the information associated with the one or more model elements.

15. A method comprising:

obtaining a model that, when executed, simulates behavior of a dynamic system,
the model including a plurality of model elements,
the plurality of model elements corresponding to one or more physical elements associated with the dynamic system,
the obtaining the model being performed by a first computing device,
the first computing device being associated with a technical computing environment (TCE);
receiving, based on obtaining the model, a request to generate a spatial representation associated with a physical element of the one or more physical elements,
the spatial representation corresponding to a three-dimensional physical structure of the physical element,
the receiving the request being performed by the first computing device;
generating a tag associated with a model element, of the plurality of model elements, that corresponds to the physical element,
the generating the tag being performed by the first computing device;
causing, based on information associated with the physical element, the spatial representation to be generated,
the tag being located on, or within, the spatial representation,
the causing the spatial representation to be generated being performed by a second computing device.

16. One or more non-transitory computer-readable media for storing instructions, the instructions comprising:

one or more instructions, executable by at least one processor, to obtain a model associated with a dynamic system,
the model including one or more blocks,
the one or more blocks having a first appearance when displayed on a user interface,
the one or more blocks including logic that, when executed, simulate behavior of a physical element associated with the dynamic system;
one or more instructions, executable by at least one processor, to receive a request to generate a report associated with the physical element,
the report corresponding to a two-dimensional representation of the physical element or a three-dimensional spatial representation of the physical element;
one or more instructions, executable by at least one processor, to generate a tag associated with the report;
one or more instructions, executable by at least one processor, to associate the tag with the one or more blocks;

one or more instructions, executable by at least one processor, to output an instruction to generate the report, the instruction including an indication that the report is to be generated in a manner that includes the tag;

one or more instructions, executable by at least one processor, to provide, for display on a display device, the user interface that includes the one or more blocks, having a second appearance, based on the tag, the second appearance being different than the first appearance and indicating that the one or more blocks are associated with the tag.

17. The one or more non-transitory computer-readable media of claim 16, where the instructions further comprise:

one or more instructions to obtain settings that identify a manner in which the report is to be generated;

one or more instructions to identify aesthetic features, associated with the report, based on the settings, the aesthetic features corresponding to at least one of:

one or more labels to be included on the report, one or more colors to be associated with the report, an indication whether the tag is to be generated, a type of tag that is to be generated, or a manner in which the tag is to be associated with the report; and one or more instructions to cause the report to be generated in a manner that conforms to the aesthetic features.

18. The one or more non-transitory computer-readable media of claim 16, where the instructions further comprise:

one or more instructions to obtain settings that identify a manner in which the report is to be generated;

one or more instructions to identify an orientation, associated with the report, based on the settings, the orientation corresponding to at least one of:

a scale on which the report is to be generated relative to the physical element, a perspective with which the report is to be generated, or one or more viewing angles, on which the report is to be based, relative to a reference angle associated with the physical element; and one or more instructions to cause the report to be generated in a manner that conforms to the identified orientation.

19. The one or more non-transitory computer-readable media of claim 16, where the instructions further comprise:

one or more instructions to obtain settings that identify a type of report to be generated, the type of report corresponding to at least one of:

a two-dimensional physical representation, of the physical element, printed on a print medium, a two-dimensional image, of the physical element, displayed on the display device, a three-dimensional physical structure, of the physical element, based on a volume of material, or a spatial image, of the physical element, displayed on the display device; and one or more instructions to output an instruction to generate the report that conforms to the identified type of report.

20. The one or more non-transitory computer-readable media of claim 19 where the instructions further comprise:

one or more instructions to determine that the type of report corresponds to the two-dimensional physical representation;

one or more instructions to create report information to be used to generate the two-dimensional physical representation, the report information identifying at least one of:

information that identifies a viewing angle, of the physical element, identified by the settings, aesthetic features, of the two-dimensional physical representation, identified by the settings, a scale, associated with the two-dimensional physical representation, identified by the settings, a perspective associated with the physical element, to be used to generate the two-dimensional physical representation, identified by the settings, or the tag; and one or more instructions to provide the report information to a printing device that causes the printing device to print the two-dimensional physical representation in a manner that conforms to the report information.

21. The one or more non-transitory computer-readable media of claim 19 where the instructions further comprise:

one or more instructions to determine that the type of report corresponds to the three-dimensional physical structure;

one or more instructions to create report information to be used to generate the three-dimensional physical structure, the report information identifying at least one of:

the material on which the three-dimensional physical structure is to be based as specified by the settings, an indication whether the tag is to be printed on, inscribed in, or embedded within the three-dimensional physical structure based on the settings, aesthetic features of the three-dimensional physical structure identified by the settings, a scale associated with the three-dimensional physical structure identified by the settings, or the tag; and one or more instructions to provide the report information to a printing device that causes the printing device to generate, using the material, the three-dimensional physical structure based on the report information.

22. The one or more non-transitory computer-readable media of claim 19 where the instructions further comprise:

one or more instructions to determine that the type of report corresponds to the spatial image;

one or more instructions to create report information to be used to generate the spatial image, the report information identifying at least one of:

two viewing angles, associated with the physical element, with which to generate a stereoscopic representation of the physical element, or two or more viewing angles, associated with the physical element, with which to generate a holographic representation of the physical element; and one or more instructions to provide, for display on the display device, the spatial image that corresponds to the stereoscopic representation or the holographic representation based on the report information.

23. The one or more non-transitory computer-readable media of claim 16, where the instructions further comprise:

one or more instructions to provide, for display on the display device, a user interface that includes a representation associated with the physical element;

one or more instructions to receive, via the user interface, a request to generate the report based on default settings, the default settings identifying a type of report or a manner in which the report is to be generated, and the default settings being predetermined by the at least one processor; and one or more instructions to cause the report to be generated in a manner that conforms to the default settings.

24. The one or more non-transitory computer-readable media of claim 16, where the instructions further comprise:

one or more instructions to provide, for display on the display device, a first user interface that depicts the physical element;

one or more instructions to receive, via the user interface, a request to generate the report associated with the physical element;

one or more instructions to provide, for display on the display device, a second user interface that enables a user to specify a type of report to be generated or features to be associated with the report;

one or more instructions to receive, via the second user interface, information that identifies the type of report or the features associated with the report; and one or more instructions to cause the report to be generated in the manner that conforms to the type of report or the features associated with the report.

25. A computing device comprising:
one or more processors to:
obtain a model that, when executed, simulates behavior of a dynamic system,
the model including a plurality of model elements,
each of the plurality of elements having a first appearance when displayed on a user interface,
the plurality of model elements corresponding to one or more physical elements associated with the dynamic system,
the computing device being associated with a technical computing environment (TCE),
receive, based on obtaining the model, a request to generate a report associated with a physical element of the one or more physical elements,
the report corresponding to a two-dimensional representation of the physical element or a spatial representation of the physical element,
obtain settings that identify a manner in which the report is to be generated,
generate a tag when the settings indicate that the tag is to be generated,
the tag including one or more symbols,
associate the tag with a model element, of the plurality of model elements, that corresponds to the physical element,
cause the report to be generated in a manner that includes the tag based on the settings and information associated with the physical element,
output the report,
receive the tag associated with the model element that corresponds to the physical element,
identify the model element that corresponds to the received tag,
alter the first appearance of the model element to generate a second appearance that indicates that the model element is associated with the tag, and
cause the model element to be displayed, in the TCE and having the second appearance, based on receiving the tag.

26. The computing device of claim 15, where the one or more processors are further to:
determine, based on the settings, that the report corresponds to a physical structure of the physical element, the physical structure being based on a volume of material, and cause, based on the settings, the physical structure to be generated in a manner that includes the tag, the tag being at least one of:
printed on a surface of the physical structure,
inscribed on a surface of the physical structure,
embedded within the material of the physical structure, or
attached to a surface of the physical structure using an adhesive material.

27. The computing device of claim 25, where the one or more processors are further to:
provide, for display on the computing device, a user interface that includes the plurality of model elements; and
cause the user interface to navigate to a portion of the model that includes the model element based on receiving the tag.

28. The computing device of claim 27, where, when causing the user interface to navigate to the portion of the one or more processors are to:
cause the user interface to zoom in or out to a portion of the model that includes the model element.

29. The computing device of claim 25, further comprising:
a component to
scan the tag from the report, and
output the scanned tag; and
where the one or more processors are further to:
receive the tag from the component,
identify a stored tag, of a plurality of tags stored within a memory associated with the computing device, that matches the received tag,
identify, within the memory, the model element that corresponds to the tag received from the component, and
display the identified model element within the TCE.

30. The computing device of claim 29, where the one or more processors are further to:
identify, within the memory, information associated with the physical element that corresponds to the tag received from the component, and
display a representation, associated with the physical element, based on the information associated with the physical element.

31. The computing device of claim 25, where the report corresponds to at least one of:
a two-dimensional physical representation of the physical element on a print media,
a two-dimensional image, of the physical element, displayed on a display device,
a three-dimensional physical structure, of the physical element, based on a volume of material, or
a three-dimensional spatial image, of the physical element, displayed on the display device.

32. The computing device of claim 31, where the three-dimensional spatial image is based on:
two viewing angles, associated with the physical element, on which a stereoscopic representation of the physical element is based, or
two or more viewing angles, associated with the physical element, on which a holographic representation of the physical element is based.

33. The method of claim 1, where the one or more symbols include at least one of a string of characters, a bar code, or a quick response code.

* * * * *